(12) United States Patent
Hiew et al.

(10) Patent No.: US 8,567,050 B2
(45) Date of Patent: *Oct. 29, 2013

(54) SINGLE SHOT MOLDING METHOD FOR COB USB/EUSB DEVICES WITH CONTACT PAD RIBS

(75) Inventors: Siew S. Hiew, San Jose, CA (US); Abraham C. Ma, Fremont, CA (US); Nan Nan, San Jose, CA (US)

(73) Assignee: Super Talent Technology, Corp., San Jose, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 13/274,188

(22) Filed: Oct. 14, 2011

(65) Prior Publication Data

US 2012/0030943 A1 Feb. 9, 2012

Related U.S. Application Data

(62) Division of application No. 12/234,581, filed on Sep. 19, 2008, now Pat. No. 8,102,657.

(51) Int. Cl.
*H05K 3/34* (2006.01)

(52) U.S. Cl.
USPC .............. 29/840; 29/829; 29/846; 29/848; 29/849; 427/96.1; 427/96.5; 439/55; 439/79; 439/374; 439/607; 439/680; 361/737; 361/715; 361/727

(58) Field of Classification Search
USPC .......... 29/829, 846, 848, 849; 427/96.1–96.5; 439/55, 607, 374, 79, 379, 610, 680; 361/737, 715, 727
See application file for complete search history.

(56) References Cited

U.S. PATENT DOCUMENTS

| | | |
|---|---|---|
| 4,671,587 A | 6/1987 | Lerner et al. |
| 5,385,479 A | 1/1995 | Okada |
| 5,397,857 A | 3/1995 | Farquhar et al. |
| 5,404,485 A | 4/1995 | Ban |
| 5,414,597 A | 5/1995 | Lindland et al. |
| 5,430,859 A | 7/1995 | Norman et al. |
| 5,479,638 A | 12/1995 | Assar et al. |
| 5,530,622 A | 6/1996 | Takiar et al. |

(Continued)

OTHER PUBLICATIONS

USB FlashCard "Main Body Dimensions", "Top View", "Bottom View" Web pages, Lexar, 2004, 3 pages.

(Continued)

*Primary Examiner* — Livius R Cazan
*Assistant Examiner* — Azm Parvez
(74) *Attorney, Agent, or Firm* — Bever, Hoffman & Harms, LLP; Patrick T. Bever

(57) ABSTRACT

A dual-personality extended USB (EUSB) system supports both USB and EUSB memory cards using an extended 9-pin EUSB socket. Each EUSB device 101 includes a PCBA having four standard USB metal contact pads disposed on an upper side of a PCB, and several extended purpose contact springs that extend through openings defined in the PCB. A single-shot molding process is used to form both an upper housing portion on the upper PCB surface that includes ribs extending between adjacent contact pads, and a lower molded housing portion that is formed over passive components and IC dies disposed on the lower PCB surface. The passive components are mounted using SMT methods, and the IC dies are mounted using COB methods. The extended 9-pin EUSB socket includes standard USB contacts and extended use contacts that communicate with the PCBA through the standard USB metal contacts and the contact springs.

8 Claims, 26 Drawing Sheets

(56) References Cited

U.S. PATENT DOCUMENTS

| | | |
|---|---|---|
| 5,563,769 A | 10/1996 | MacGregor |
| 5,623,552 A | 4/1997 | Lane |
| 5,725,395 A | 3/1998 | Lee |
| 5,754,397 A | 5/1998 | Howell et al. |
| 5,821,614 A | 10/1998 | Hashimoto et al. |
| 5,835,760 A | 11/1998 | Harmer |
| 5,891,483 A | 4/1999 | Miyajima |
| 5,941,733 A | 8/1999 | Lai |
| 5,959,541 A | 9/1999 | DiMaria et al. |
| 6,000,006 A | 12/1999 | Bruce et al. |
| 6,012,636 A | 1/2000 | Smith |
| 6,027,375 A | 2/2000 | Wu |
| 6,036,549 A | 3/2000 | Wulff |
| 6,040,622 A | 3/2000 | Wallace |
| 6,044,428 A | 3/2000 | Rayabhari |
| 6,069,920 A | 5/2000 | Schulz et al. |
| 6,102,743 A | 8/2000 | Haffenden et al. |
| 6,125,192 A | 9/2000 | Bjorn et al. |
| 6,148,354 A | 11/2000 | Ban et al. |
| 6,165,016 A | 12/2000 | Lai |
| 6,166,913 A | 12/2000 | Fun et al. |
| 6,193,152 B1 | 2/2001 | Fernando et al. |
| 6,231,363 B1 | 5/2001 | Kosmala |
| 6,241,534 B1 | 6/2001 | Neer et al. |
| D445,096 S | 7/2001 | Wallace |
| 6,278,822 B1 | 8/2001 | Dawnay |
| 6,292,863 B1 | 9/2001 | Terasaki et al. |
| 6,297,448 B1 | 10/2001 | Hara |
| 6,313,400 B1 | 11/2001 | Mosquera et al. |
| 6,315,582 B1 | 11/2001 | Nishio et al. |
| 6,315,609 B1 | 11/2001 | Chung |
| 6,321,478 B1 | 11/2001 | Klebes |
| D452,690 S | 1/2002 | Wallace et al. |
| D452,865 S | 1/2002 | Wallace et al. |
| 6,334,793 B1 | 1/2002 | Amoni et al. |
| D453,934 S | 2/2002 | Wallace et al. |
| 6,381,143 B1 | 4/2002 | Nakamura |
| 6,385,677 B1 | 5/2002 | Yao |
| 6,399,906 B1 | 6/2002 | Sato et al. |
| 6,410,355 B1 | 6/2002 | Wallace |
| 6,438,638 B1 | 8/2002 | Jones et al. |
| 6,439,464 B1 | 8/2002 | Fruhauf et al. |
| 6,444,501 B1 | 9/2002 | Bolken |
| 6,462,273 B1 | 10/2002 | Corisis et al. |
| 6,462,953 B2 | 10/2002 | Tong et al. |
| 6,475,830 B1 | 11/2002 | Brillhart |
| 6,490,163 B1 | 12/2002 | Pua et al. |
| 6,527,188 B1 | 3/2003 | Shobara et al. |
| 6,533,612 B1 | 3/2003 | Lee et al. |
| 6,561,421 B1 | 5/2003 | Yu |
| 6,567,273 B1 | 5/2003 | Liu et al. |
| 6,570,825 B2 | 5/2003 | Miranda et al. |
| 6,573,567 B1 | 6/2003 | Nishizawa et al. |
| 6,580,615 B1 | 6/2003 | Nakanishi et al. |
| 6,615,404 B1 | 9/2003 | Garfunkel et al. |
| 6,618,243 B1 | 9/2003 | Tirosh |
| 6,624,005 B1 | 9/2003 | DiCaprio et al. |
| 6,629,181 B1 | 9/2003 | Alappat et al. |
| 6,629,851 B2 | 10/2003 | Kikuchi et al. |
| 6,634,561 B1 | 10/2003 | Wallace |
| 6,671,808 B1 | 12/2003 | Abbott et al. |
| 6,676,419 B1 | 1/2004 | Lin et al. |
| 6,676,420 B1 | 1/2004 | Liu et al. |
| 6,718,407 B2 | 4/2004 | Martwick |
| 6,733,329 B2 | 5/2004 | Yang |
| 6,740,964 B2 | 5/2004 | Sasaki |
| 6,744,634 B2 | 6/2004 | Yen |
| 6,757,783 B2 | 6/2004 | Koh |
| 6,763,410 B2 | 7/2004 | Yu |
| 6,773,192 B1 | 8/2004 | Chao |
| 6,778,401 B1 | 8/2004 | Yu et al. |
| 6,832,281 B2 | 12/2004 | Jones et al. |
| 6,854,984 B1 | 2/2005 | Lee et al. |
| 6,877,994 B2 | 4/2005 | Huang |
| 6,900,988 B2 | 5/2005 | Yen |
| 6,922,343 B2 | 7/2005 | Nakanishi et al. |
| 6,924,547 B2 | 8/2005 | Kanemoto et al. |
| 6,932,629 B2 | 8/2005 | Ikenoue |
| 6,940,153 B2 | 9/2005 | Spencer et al. |
| 6,944,028 B1 | 9/2005 | Yu et al. |
| 6,979,210 B2 | 12/2005 | Regen et al. |
| 6,980,188 B1 | 12/2005 | Worley, III et al. |
| 7,004,780 B1 | 2/2006 | Wang |
| 7,009,847 B1 | 3/2006 | Wu et al. |
| 7,011,247 B2 | 3/2006 | Drabczuk et al. |
| 7,017,248 B2 | 3/2006 | Choi et al. |
| 7,021,971 B2 | 4/2006 | Chou et al. |
| 7,035,110 B1 | 4/2006 | Wang et al. |
| 7,048,197 B2 | 5/2006 | Nishizawa et al. |
| 7,055,757 B2 | 6/2006 | Nishizawa et al. |
| 7,059,871 B1 | 6/2006 | Hsiao |
| 7,089,661 B2 * | 8/2006 | Fong et al. ............ 29/841 |
| 7,104,809 B1 | 9/2006 | Huang |
| 7,104,848 B1 | 9/2006 | Chou et al. |
| 7,108,560 B1 | 9/2006 | Chou et al. |
| 7,125,287 B1 | 10/2006 | Chou et al. |
| 7,153,148 B2 | 12/2006 | Chen et al. |
| 7,224,052 B2 | 5/2007 | Nishizawa et al. |
| 7,234,644 B2 | 6/2007 | Nishizawa et al. |
| 7,238,053 B1 | 7/2007 | Liu et al. |
| 7,259,967 B2 | 8/2007 | Ni |
| 7,269,004 B1 | 9/2007 | Ni et al. |
| 7,296,098 B2 | 11/2007 | Shih |
| 7,361,032 B2 | 4/2008 | Loftus |
| 7,364,090 B2 | 4/2008 | Cuellar et al. |
| 7,375,975 B1 | 5/2008 | Jang et al. |
| 7,392,230 B2 | 6/2008 | Nugent |
| 7,416,419 B2 | 8/2008 | Collantes, Jr. et al. |
| 7,422,454 B2 | 9/2008 | Tang et al. |
| 7,462,044 B1 | 12/2008 | Regen et al. |
| 7,473,112 B2 | 1/2009 | Zhu et al. |
| 7,540,784 B1 | 6/2009 | Zhang et al. |
| 7,547,961 B2 | 6/2009 | Nishizawa et al. |
| 7,608,787 B2 | 10/2009 | Takemoto et al. |
| 7,616,447 B2 | 11/2009 | Yamada et al. |
| 7,652,892 B2 | 1/2010 | Shiu et al. |
| 7,709,946 B2 | 5/2010 | Ryu et al. |
| 7,798,821 B2 | 9/2010 | Liu et al. |
| 7,872,873 B2 * | 1/2011 | Hiew et al. ............ 361/737 |
| 2001/0038547 A1 | 11/2001 | Jigour et al. |
| 2001/0043174 A1 | 11/2001 | Jacobsen et al. |
| 2002/0036922 A1 | 3/2002 | Roohparvar |
| 2002/0116668 A1 | 8/2002 | Chhor et al. |
| 2002/0166023 A1 | 11/2002 | Nolan et al. |
| 2002/0186549 A1 | 12/2002 | Bolken |
| 2003/0038043 A1 | 2/2003 | Painsith |
| 2003/0046510 A1 | 3/2003 | North |
| 2003/0094490 A1 | 5/2003 | Lee |
| 2003/0100203 A1 | 5/2003 | Yen |
| 2003/0104835 A1 | 6/2003 | Douhet |
| 2003/0145141 A1 | 7/2003 | Chen et al. |
| 2003/0163656 A1 | 8/2003 | Ganton |
| 2003/0177300 A1 | 9/2003 | Lee et al. |
| 2003/0182528 A1 | 9/2003 | Ajiro |
| 2003/0198028 A1 | 10/2003 | Nakanishi et al. |
| 2003/0207601 A1 | 11/2003 | Adachi |
| 2003/0223286 A1 | 12/2003 | Lee |
| 2004/0034765 A1 | 2/2004 | James |
| 2004/0066693 A1 | 4/2004 | Osako |
| 2004/0087213 A1 | 5/2004 | Kao |
| 2004/0137664 A1 | 7/2004 | Elazar et al. |
| 2004/0143716 A1 | 7/2004 | Hong |
| 2004/0145875 A1 | 7/2004 | Yu et al. |
| 2004/0148482 A1 | 7/2004 | Grundy et al. |
| 2004/0153595 A1 | 8/2004 | Sukegawa et al. |
| 2004/0195339 A1 | 10/2004 | Chen et al. |
| 2004/0255054 A1 | 12/2004 | Pua et al. |
| 2005/0009388 A1 | 1/2005 | Chao |
| 2005/0114587 A1 | 5/2005 | Chou et al. |
| 2005/0182858 A1 | 8/2005 | Lo et al. |
| 2005/0193161 A1 | 9/2005 | Lee et al. |
| 2005/0193162 A1 | 9/2005 | Chou et al. |
| 2005/0216624 A1 | 9/2005 | Deng et al. |
| 2005/0218200 A1 | 10/2005 | Focke et al. |

(56) References Cited

U.S. PATENT DOCUMENTS

| | | |
|---|---|---|
| 2005/0248926 A1 | 11/2005 | Asom et al. |
| 2005/0254219 A1 | 11/2005 | Nakanishi et al. |
| 2007/0263365 A1 | 11/2007 | Yamada et al. |
| 2008/0093720 A1 | 4/2008 | Hiew et al. |
| 2008/0094807 A1 | 4/2008 | Hiew et al. |

OTHER PUBLICATIONS

USB 'A' Plug Form Factor, Revision 0.9, Guideline for Embedded USB Device Applications, Nov. 29, 2004, 4 pages.

PQ1, "Intelligent Stick" F1ADP/1699 Web, Sep. 2003, 2 pages.

\* cited by examiner

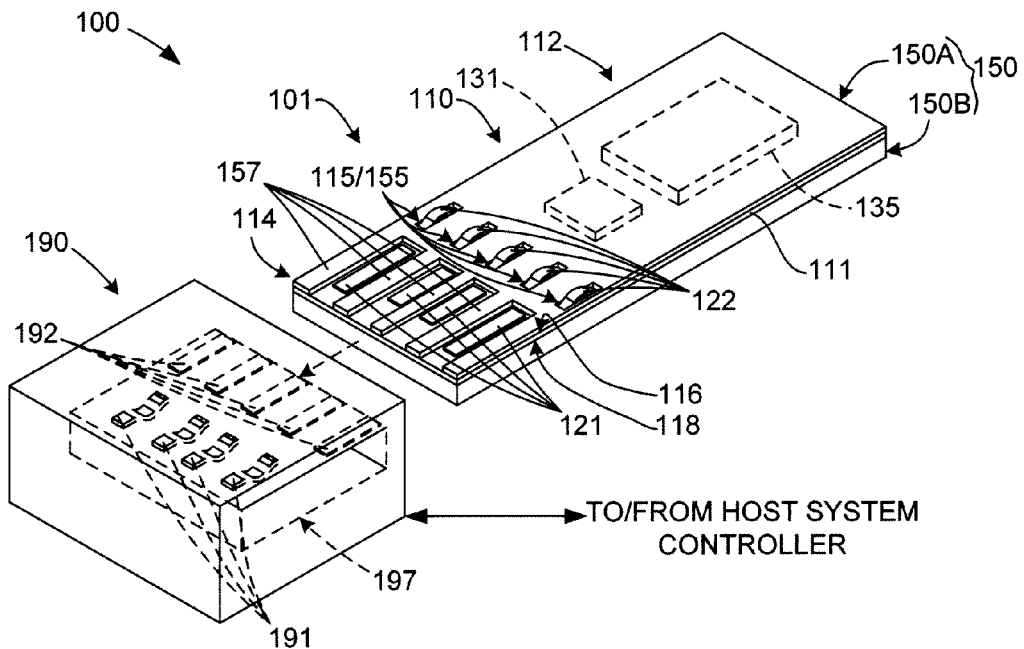
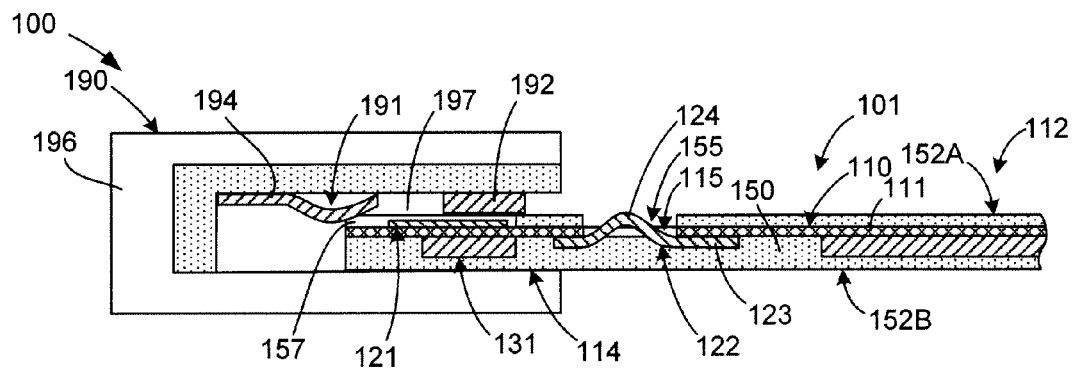
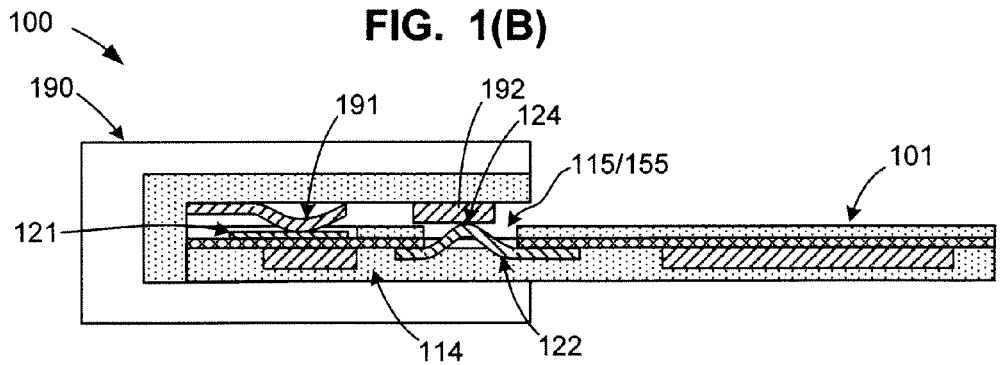
FIG. 1(A)
FIG. 1(B)
FIG. 1(C)

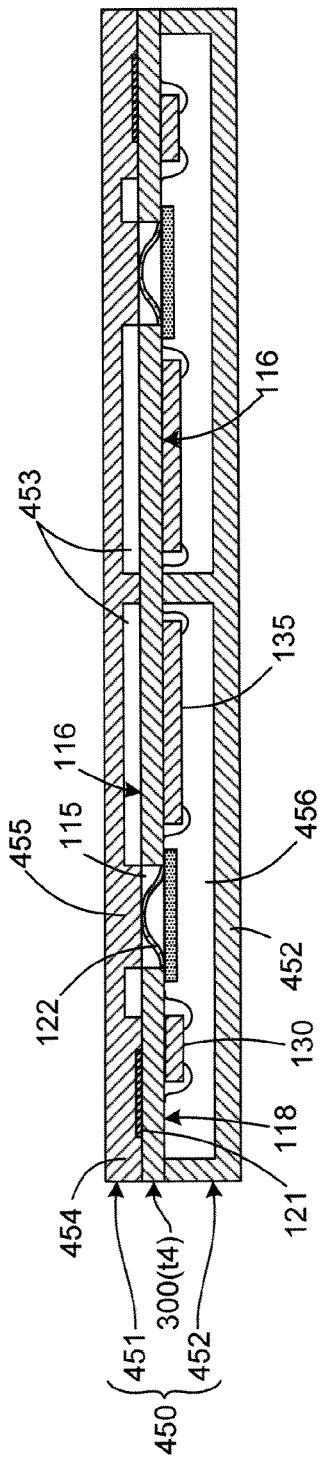
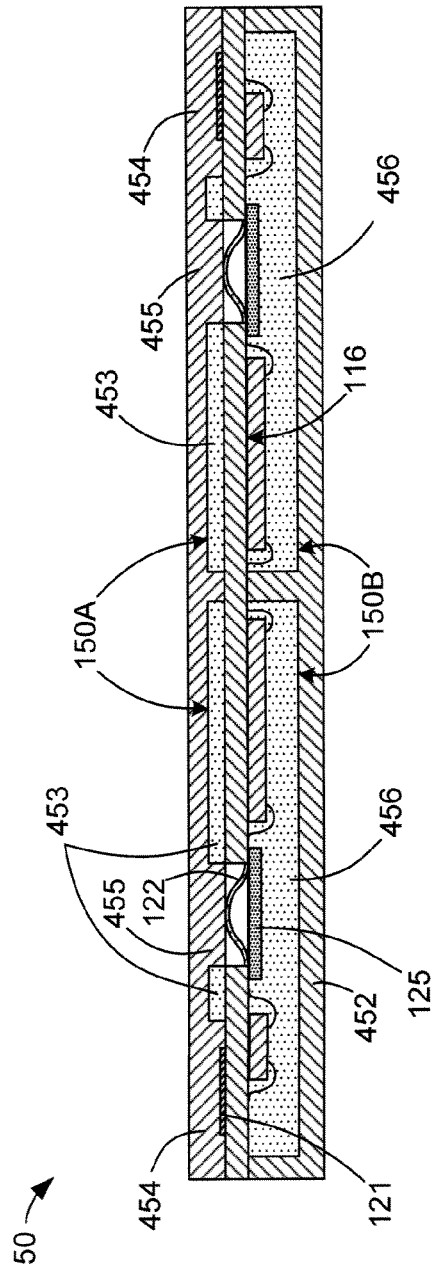

SINGLE SHOT MOLDING METHOD FOR COB USB/EUSB DEVICES WITH CONTACT PAD RIBS

RELATED APPLICATIONS

This application is a divisional of U.S. Patent application for "SINGLE SHOT MOLDING METHOD FOR COB USB/EUSB DEVICES WITH CONTACT PAD RIBS", U.S. application Ser. No. 12/234,581, filed Sep. 19, 2008, now U.S. Pat. No. 8,102,657.

This application is also related to U.S. Patent application for "Extended COB-USB with Dual-Personality Contacts" U.S. application Ser. No. 12/124,081, filed May 20, 2008, now U.S. Pat. No. 7,872,873.

This application is also related to U.S. Patent application for "Direct Package Mold Process for Single Chip SD Flash Cards" U.S. application Ser. No. 12/175,753, filed Jul. 18, 2008, now abandoned.

This application is also related to "Assembly Including Slim Female USB Connector and Slim Male USB Connector with Spring-Engaging Depressions, Stabilizing Dividers and Wider End Rails" now U.S. Pat. No. RE40,115, and to "Manufacturing Methods for Ultra-Slim USB Flash-Memory Card with Supporting Dividers or Underside Ribs", now U.S. Pat. No. 7,094,074.

FIELD OF THE INVENTION

This invention relates to portable electronic devices, and more particularly to portable electronic devices including Universal-Serial-Bus (USB) or Expanded Universal-Serial-Bus (EUSB) connections.

BACKGROUND OF THE INVENTION

Universal-Serial-Bus (USB) has been widely deployed as a standard bus for connecting peripherals such as digital cameras and music players to personal computers (PCs) and other devices. Currently, the top transfer rate of USB is 480 Mb/s, which is quite sufficient for most applications. Faster serial-bus interfaces are being introduced to address different requirements. PCI Express, at 2.5 Gb/s, and SATA, at 1.5 Gb/s and 3.0 Gb/s, are two examples of high-speed serial bus interfaces for the next generation devices, as are IEEE 1394 and Serial Attached Small-Computer System Interface (SCSI).

FIG. 30(A) shows a prior-art peripheral-side USB connector. USB connector 10 may be mounted on a board in the peripheral. USB connector 10 can be mounted in an opening in a plastic case (not shown) for the peripheral.

USB connector 10 contains a small connector substrate 14, which is often white ceramic, black rigid plastic, or another sturdy substrate. Connector substrate 14 has four or more metal contacts 16 formed thereon. Metal contacts 16 carry the USB signals generated or received by a controller chip in the peripheral. USB signals include power, ground, and serial differential data D+, D−.

USB connector 10 contains a metal case that wraps around connector substrate 14. The metal case touches connector substrate 14 on three of the sides of connector substrate 14. The top side of connector substrate 14, holding metal contacts 16, has a large gap to the top of the metal case. On the top and bottom of this metal wrap are formed holes 12. USB connector 10 is a male connector, such as a type-A USB connector.

FIG. 30(B) shows a female USB connector. Female USB connector 20 can be an integral part of a host or PC, or can be connected by a cable. Another connector substrate 22 contains four metal contacts 24 that make electrical contact with the four metal contacts 16 of the male USB connector 10 of FIG. 30(A). Connector substrate 22 is wrapped by a metal case, but small gaps are between the metal case and connector substrate 22 on the lower three sides.

Locking is provided by metal springs 18 in the top and bottom of the metal case. When male USB connector 10 of FIG. 30(A) is flipped over and inserted into Female USB connector 20 of FIG. 30(B), metal springs 18 lock into holes 12 of male USB connector 10. This allows the metal casings to be connected together and grounded.

Other bus interfaces offer higher transfer rates than USB devices, which have a top transfer rate of 480 Mb/s. For example, Peripheral-Component-Interconnect (PCI) Express (2.5 Gb/s) and Serial-Advanced-Technology-Attachment (SATA) (1.5 Gb/s and 3.0 Gb/s) are two examples of high-speed serial bus interfaces for next generation devices. IEEE 1394 (Firewire) supports 3.2 Gb/s. Serial Attached Small-Computer System Interface (SCSI) supports 1.5 Gb/s. These high speed interfaces renders standard USB devices undesirable for some applications.

What is needed is a high speed USB flash memory device using a single dual-personality flexible system that supports both standard Universal-Serial-Bus (USB) devices and a higher speed USB targeted at 5.0 Gb/S with the addition of extra transmit and receive signal pairs, plus a ground line that serves as separating line to the two communication signal pairs that make up the extended five additional pins.

SUMMARY OF THE INVENTION

The present invention is directed to both standard USB 2.0 devices and high speed extended USB (EUSB) devices in which a printed circuit board assembly (PCBA) is encased within a single-shot molded housing. According to an aspect of the present invention, the PCBA includes a PCB having standard USB metal contact pads disposed on a top (first) surface, and all passive components and integrated circuits (ICs) mounted on a bottom (second) surface. In accordance with an aspect of the invention, single-shot molded housing is formed in a single shot molding process such that a thin top (first) portion of the housing is formed on the first surface of the PCBA, and a second portion of the housing is formed on the second surface of the PCBA such that the passive components and ICs are encased by the bottom portion. By utilizing a single shot molding process to form the single-shot molded housing over the PCBA, the present invention provides an inexpensive manufacturing method (i.e., lower cost and high assembly throughput when compared with assembly using external shell casings) that also provides greater moisture and water resistance and higher impact force resistance than that achieved using conventional manufacturing methods. In accordance with another aspect of the invention, the top portion of the molded housing is formed with elongated ribs that extend between associated pairs of the standard USB metal contact pads. These ribs provide the advantage of serving as a guide for host connector pins to avoid shorting to adjacent pins when the USB device is slanted at an angle in the host socket, and also serve to prevent undesirable wear of the standard USB metal contact pads due to repeated insertion into a host socket.

In accordance with an embodiment of the present invention, a dual-personality memory system supports both standard USB 2.0 devices and high speed extended USB (EUSB) devices that are formed in accordance with the method provided above. A host side of the dual-personality memory system includes a multiple pin (e.g., nine-pin) USB female socket that is similar to a standard female USB socket, but in addition to the standard (four) USB contact pins utilized to facilitate communications with standard USB 2.0 devices, the extended multiple pin USB socket includes one or more additional rows of contacts that facilitate extended communications (i.e., including additional transmitting/receiving differential pairs) between the host system and dual personality "extended" USB (EUSB) devices (e.g., memory cards). Each EUSB device 101 includes both standard USB contacts, a second row of extended function contacts, and a special controller that facilitates communication with a host system using either the standard serial USB communication protocol using the four standard USB contacts (e.g., when the EUSB memory card is plugged into a "standard" USB female socket), or extended communications using both the standard contacts and the second row of contacts (e.g., when the EUSB memory card is plugged into the multiple pin USB female socket of a dual-personality memory system).

In accordance with a specific embodiment of the present invention, a EUSB device 101 includes both standard USB metal contacts and a row of metal contact springs that exposed by openings formed in the top (first) portion of the molded housing, and extend from the EUSB memory card in a way that facilitates reliable extended (e.g., nine bit) communications. The EUSB device 101 includes a printed circuit board assembly (PCBA) including at least one dual-personality communication integrated circuit (IC) mounted on a lower surface of the PCB, four standard USB fixed contacts disposed on an upper surface of the PCB near the PCB's front edge, and several (e.g., five) metal contact springs positioned behind the standard USB contacts. In accordance with an aspect of the invention, the PCB is formed with parallel slots (openings) that are disposed behind the standard USB contacts, and the metal contact springs are mounted such that a portion of each metal contact spring extends through a corresponding slot and through a corresponding opening such that a contact portion of each contact spring protrudes above the upper planar surface defined by the top portion of the molded housing. A dual-personality communication IC is configured to selectively communicate either with a standard USB host system by way of the standard USB contacts (only), or with a dual-personality flash memory card system by way of all (e.g., nine) contact pads/springs. By forming the contact springs such that they extend through the slots/openings and protrude above the housing surface, the contact springs are provided with sufficient tolerance to both reliably contact corresponding contact pads of a host female socket, and are also able to bend downward (i.e., into the molded housing) when the contact springs are pressed against the corresponding contact pads of a host female socket.

In accordance with another embodiment of the present invention, the EUSB device 101 is manufactured by forming a contact spring assembly in which the contact springs are mounted on a base (e.g., a PCB or plastic) substrate, and the assembly is then mounted onto the device PCB such that the springs protrude through the parallel slots (openings) defined in the PCB. The PCB includes standard USB contact pads formed on its upper surface between its front edge and the row of slots, and contact pads formed on its lower PCB surface for mounting one or more ICs and passive components. According to an aspect of the invention, the spring assembly is mounted onto the lower surface of the PCB such that each contact spring extends through a corresponding slot such that a contact portion thereof protrudes from the upper PCB surface (and above the upper planar surface of the top housing portion after the molding process is completed), and such that the base covers the slots during a subsequent plastic molding step. By forming the PCBA in this manner, the springs are quickly and reliably mounted onto the PCB, and the base of the spring assembly covers the slots. The PCBA is then placed in a mold cavity, and a single-shot molded housing is formed such that a top housing portion is formed on the top PCB surface (i.e., except over the standard USB metal contact pads and contact springs), and a bottom housing portion is formed over the bottom PCB surface such that the passive components and ICs are entirely encased in housing material. The upper mold die used to form the top portion of the molded housing includes parallel bars and protrusions (poles) that respectively cover and prevent the formation of molding material on the contact pads and contact springs. The resulting EUSB memory card forms a modular structure including a connector plug with the standard USB metal contact pads and the contact springs being arranged such that, when said connector plug is inserted into said extended multiple pin USB socket, each of the standard USB contact pads contacts a corresponding standard USB contact of the extended multiple pin USB socket, and each of the contact springs contacts a corresponding dual-personality contact of the extended multiple pin USB socket. By forming the EUSB memory card in this manner, final assembly of the EUSB memory card into any of several external housings is greatly simplified, which reduces manufacturing costs by simplifying the assembly process.

According to an aspect of the invention, passive components are mounted onto the PCB using one or more standard surface mount technology (SMT) techniques, and one or more unpackaged IC die (e.g., the dual-personality communication IC die and a flash memory die) are mounted using chip-on-board (COB) techniques. During the SMT process, the SMT-packaged passive components (e.g., capacitors, oscillators, and light emitting diodes) are mounted onto contact pads disposed on the PCB, and then known solder reflow techniques are utilized to connect leads of the passive components to the contact pads. During the subsequent COB process, the IC dies are secured onto the PCB using know die-bonding techniques, and then electrically connected to corresponding contact pads using, e.g., known wire bonding techniques. After the COB process is completed, the housing is formed over the passive components and IC dies using plastic molding techniques. By combining SMT and COB manufacturing techniques to produce modular USB core components, the present invention provides several advantages over conventional manufacturing methods that utilize SMT techniques only. First, by utilizing COB techniques to mount the USB controller and flash memory, the large PCB area typically taken up by SMT-packaged controllers and flash devices is dramatically reduced, thereby facilitating significant miniaturization of the resulting footprint (i.e., providing a shorter device length and thinner device width). Second, the IC die height is greatly reduced, thereby facilitating stacked memory arrangements that greatly increase memory capacity of the EUSB memory cards without increasing the EUSB memory card footprint. Further, overall manufacturing costs are reduced by utilizing unpackaged controllers and flash devices (i.e., by eliminating the cost associated with SMT-package normally provided on the controllers and flash devices). Therefore, the combined COB and SMT method according to the present invention provides a less expensive and higher quality (i.e., more reliable) memory product with a smaller size than that possible using conventional SMT-only manufacturing methods.

According to another embodiment of the present invention, front edges of the parallel ribs formed on the upper surface of a USB or EUSB device are linked by a cross-rib that serves to protect the front edge of the PCBA, to prevent a user's finger from touching the four standard USB contact pads, and to provide extra thickness for the five "extended" pins to form higher loop so that the spring action is more flexible.

According to yet another embodiment of the present invention, the standard USB metal contact pads of a USB or EUSB device comprise raised middle rails that facilitate better contact with the spring metal contacts of a female USB connector socket.

According to an embodiment of the present invention, the EUSB device 101 is disposed in a plastic molded external housing so as to form a device assembly including a standard USB metal plug shell and a cover. By forming the EUSB memory card in the manner described above, the present invention greatly simplifies the assembly process utilized to form the device assembly, thus reducing overall costs.

BRIEF DESCRIPTION OF THE DRAWINGS

These and other features, aspects and advantages of the present invention will become better understood with regard to the following description, appended claims, and accompanying drawings, where:

FIGS. 1(A), 1(B), 1(C) are perspective top, cross sectional side and cross sectional side views, respectively, showing a dual-personality USB memory system including an EUSB memory card according to a simplified embodiment of the present invention;

FIGS. 17(A) and 17(B) are simplified cross-sectional side views depicting a molding process for forming a molded housings over the PCB panel of FIG. 14(B) utilizing the molding die assembly of FIG. 15 according to the method of FIG. 4;

DETAILED DESCRIPTION OF THE DRAWINGS

Figure 2:
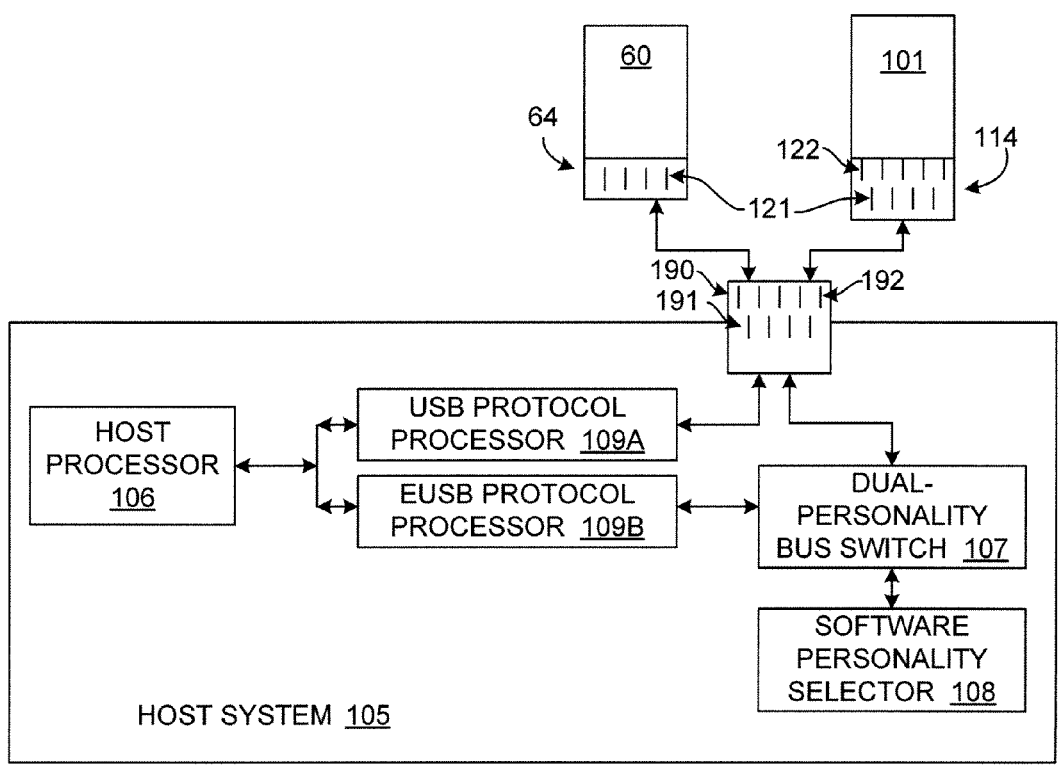
FIG. 2 is a simplified block diagram showing a host system of the dual-personality USB memory system of FIG. 1.

The present invention relates to an improved method for manufacturing extended USB (EUSB) devices (e.g., memory cards), and in particular to EUSB devices (memory cards) manufactured by the method. The following description is presented to enable one of ordinary skill in the art to make and use the invention as provided in the context of a particular application and its requirements. As used herein, the terms "upper", "upwards", "lower", "downward", "front" and "back" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIGS. 1(A), 1(B) and 1(C) show a dual-personality USB memory system 100 including an extended 9-pin (multiple pin) USB female socket 190 that communicates with both standard USB memory cards and dual-personality extended USB (EUSB) memory cards 101 that are manufactured and operate in accordance with the present invention. That is, in accordance with the exemplary embodiment, dual-personality USB memory system 100 is operated to process (receive and transmit) both standard USB 2.0 (four pin) signals and extended function signals through extended 9-pin USB socket 190 in a manner consistent with that described in co-owned U.S. Pat. No. 7,108,560, entitled "Extend USB Protocol Plug and Receptacle for implementing Single-Mode Communication", which is incorporated herein by reference in its entirety. In particular, in accordance with the 9-pin embodiment disclosed herein, in additional to the four standard USB 2.0 signals (i.e., power, ground, D+ and D−), the extra five contact springs are utilized to transmit and additional ground (e.g., using the middle spring), a transmitting differential pair (T+ and T−), and a receiving differential pair (R+ and R−) using the left and right side contact spring pairs, respectively. Thus the term "extended USB" (EUSB) is used herein to mean at least one transmitting/receiving signal pair in addition to the four standard USB signals. With the additional of these signal pairs, transmitting/receiving modes can be executed concurrently without the wait state of transmitting on receiving to complete, and vice versa, thereby significantly enhancing communication speeds.

Referring to the right side of FIG. 1(A) and FIG. 1(B), EUSB device 101 generally includes a printed circuit board assembly (PCBA) 110 and a single-shot molded plastic housing 150 including an upper portion 150A and a lower portion 150B. PCBA 110 includes a printed circuit board (PCB) 111 having opposing upper (first) surface 116 and an opposing lower (second) surface 118, and includes a handle (rear) portion 112 and a male plug (front portion) connector 114. According to an aspect of the present invention, male plug connector 114 includes four standard USB (metal) contacts 121 (disposed on upper surface 116 in accordance with standard techniques, and five extended-use (metal) contact springs 122 disposed such that portions thereof extend through slots (openings 115) defined in PCB 111 and through openings 155 defined in upper housing portion 150A, and arranged in a row behind standard USB contacts 121. A dual-personality communication integrated circuit (IC) 131 is mounted on lower surface 118, and conductive traces (not shown) are formed on PCB 111 using known techniques such that contacts 121 and 122 are connected to dual-personality communication IC 131. In addition, a memory (e.g., flash) IC 135 is mounted on lower surface 118 and connected to dual-personality communication IC 131 and contacts 121 and 122 by conductive traces (not shown). Other features and details associated with extended USB device 101 are provided below.

Because many conventional USB (male) connectors and (female) sockets (also referred to as standard USB plug connectors and standard USB sockets herein) are widely deployed, it is advantageous for the improved extended USB connector to be compatible with standard USB sockets, and an extended USB socket to be compatible with standard USB connectors for backward compatibility. Although the height and width of USB connectors/sockets have to remain the same for insertion compatibility, the length of each may be extended to fit additional metal contacts for additional signals. Furthermore, additional metal contacts (pins or springs) may be disposed on the plug connector, either adjacent to opposite the existing four standard USB metal contacts. As indicated in FIG. 1(A), plug connector 114 of EUSB device 101 represents such extended plug connector that includes the four standard USB metal contact pads 121 and the five additional (extended-use) contact springs 122 that are disposed in a row behind standard USB metal contact pads 121.

Referring to FIG. 1(B), to support communications with EUSB device 101, extended 9-pin USB female socket 190 includes four standard USB metal contact pins 191 and five additional (dual-personality) contact pads 192 that are disposed on the bottom surface of a pin substrate 194 to engage standard USB metal contact pads 121 and additional contact springs 122 when plug connector 114 is inserted therein. Female socket 190 also includes an outer (e.g., metal) casing 196 that cooperates with substrate 194 to define a cavity (slot) 197 for receiving plug connector 114. FIG. 1(B) shows plug connector 114 inserted into 9-pin USB socket 190 such that standard USB metal contact pins 191 of socket 190 contact standard USB metal contacts 121 of extended USB device 101, and additional contact pads 192 of socket 190 contact additional contact springs 122 of extended USB device 101, thereby facilitating 9-pin communication between extended USB device 101 and a host system controller (not shown) that is connected to socket 190.

As indicated in FIGS. 1(B) and 1(C), each contact spring 122 extends through a corresponding slot/opening 115/155 and protrudes above a planar upper surface 152A defined by upper housing portion 150A by an amount that is sufficient to reliably contact corresponding contact pads 192 when EUSB device 101 is inserted into host female socket 190. That is, each metal contact spring 122 includes a base portion 123 that is disposed on the lower side of PCB 111, and includes a contact portion 124 that protrudes through its corresponding slot/opening 115/155 and extends above upper surface 152A. Each metal contact spring 122 is connected to at least one of dual-personality communication IC 131 and memory IC 135 by corresponding conductive traces (not shown). FIG. 1(B) shows EUSB device 101 partially inserted into host female socket 190, and shows that a lower surface of contact pad 192 is below the upper point of contact portion 124, whereby when EUSB device 101 is fully inserted (as shown in FIG. 1(C)), contact portion 124 reliably contacts contact pad 192, and contact spring 122 bends downward slightly into opening 115. By forming each contact spring 122 in this manner, contact portion 124 is provided with sufficient tolerance (i.e., extends far enough above upper surface 116) to assure contact with corresponding contact pad 192, and the ability to flex downward when such contact occurs, thereby providing a suitable design variance that produces reliable connection between extended-USB socket 190 and EUSB device 101.

In accordance with an aspect of the present invention, both upper portion 150A and lower portion 150B of single-shot molded housing 150 include planar surfaces that are simultaneously formed during a single-shot molding process described below, where the molding die (cover plate) used to form upper housing portion 150A is provided with structures arranged to prevent the formation of molding material on contact pads 121 and contact springs 122. In particular, as shown in FIG. 1(A), upper portion 150A is formed such that several parallel elongated ribs 157 extend between associated pairs of metal contact pads 121. By providing elongated ribs 157 between metal contact pads 121 in this manner, the present invention protects metal contact pads 121 from undesirable wear due to repeated insertion into a host female socket, thereby extending the operating life of EUSB device 101.

FIG. 2 is a block diagram of an exemplary host system 105 with one embodiment of extended-USB socket 190 that supports extended-mode communication. Although the description below refers only to communications with standard USB memory cards 60 and EUSB device 101, those skilled in the art will recognize that the sockets and extended USB memory card features described herein can be altered to accommodate one or more of a variety of other flash memory devices (e.g., SD, MMC, SATA, PCI-Express, Firewire IEEE 1394, or Serial-Attached SCSI). As shown in FIG. 2, host system 105 includes a processor 106 for executing programs including USB-management and bus-scheduling programs. Dual-personality serial-bus interface 107 processes data from processor 106 using two protocol processors including a standard USB protocol processor 109A and an EUSB protocol processor 109B. USB processor 109A processes data using the USB protocol, and inputs and outputs USB data on the four standard USB contacts 191 in extended USB socket 190 (which communicate with standard USB metal contacts 121 of an inserted standard USB memory card 60 or EUSB device 101). In contrast, the extended metal contact pins 192 of extended USB socket 190 (which communicate with contact springs 122 of EUSB device 101, when inserted therein) are connected to dual-personality bus switch 107. Transceivers in dual-personality bus switch 107 buffer data transmitted and received as pairs of differential signals sent over data lines connected to the extended metal contacts to facilitate the EUSB protocol. When an initialization routine executed by processor 106 determines that inserted flash memory device supports the EUSB protocol, personality selector 108 configures dual-personality bus switch 107 to connect extended USB socket 190 to EUSB processor 109B. Processor 106 communicates with EUSB processor 109B instead of USB processor 109A when extended mode is activated. Additional details regarding the operation of host 105 will be apparent to those skilled in the art based on the teachings in U.S. Pat. No. 7,108,560 (cited above) and the description provided below.

Figure 3A:
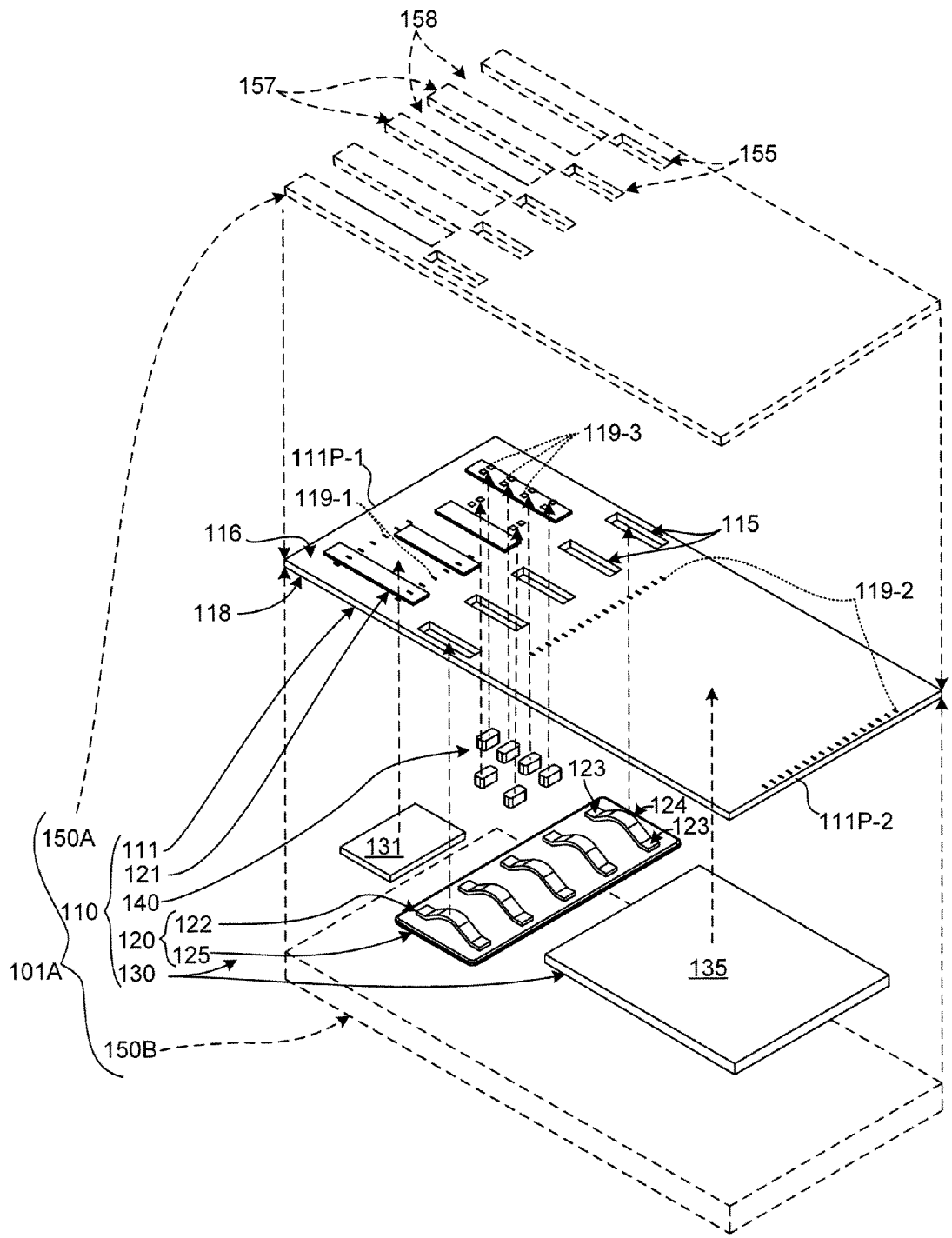
FIGS. 3(A) and 3(B) are exploded perspective and assembled perspective views showing an EUSB memory card according to a specific embodiment of the present invention.
Figure 3B:
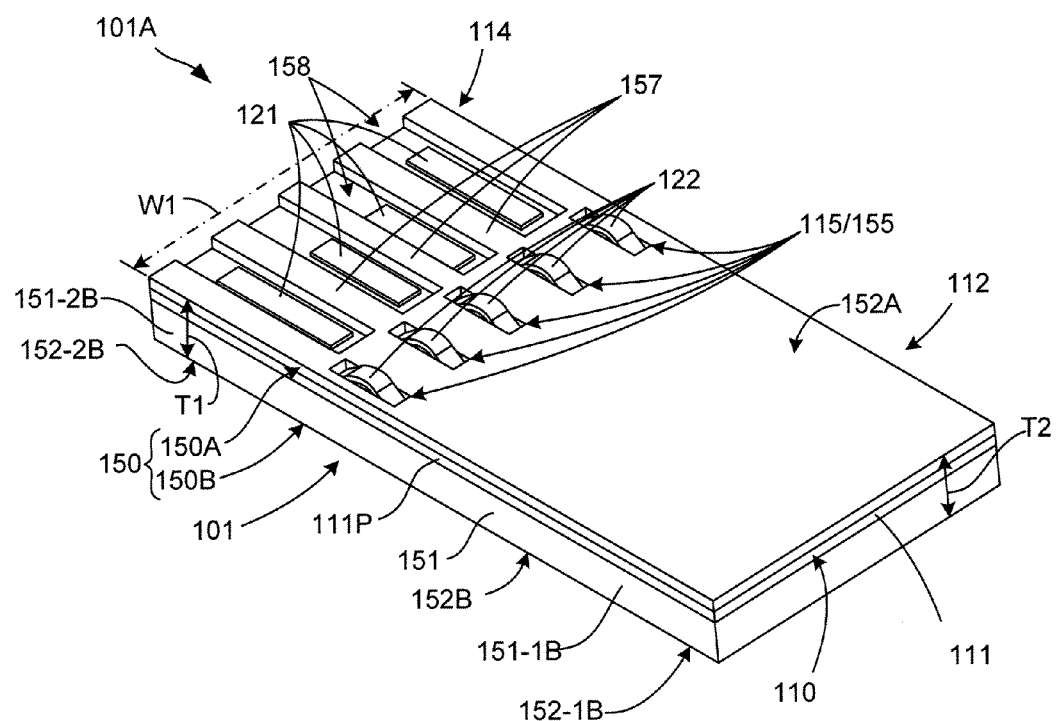

FIGS. 3(A) and 3(B) are exploded perspective and assembled perspective views showing a simplified EUSB device 101A that is produced according to a simplified specific embodiment of the present invention. As set forth below, and with reference to the flow diagram of FIG. 4, EUSB device 101A is manufactured by forming a contact spring assembly 120 in which contact springs 122 are mounted on a base (e.g., a PCB or plastic) substrate 125, and spring assembly 120 is then mounted onto PCB 111 such that contact portions 124 of each contact spring 122 protrude through corresponding slots/openings 115/155, and base 125 covers the lower side of openings 115 during a subsequent single-shot plastic molding step (described below) that is used to form single-shot molded housing 150.

Similar to the general embodiment described above with reference to FIGS. 1(A) and 1(B), EUSB device 101A includes a PCBA 110 made up of a PCB 111 with standard USB contacts 121 formed on its upper surface 116 between front edge portion 111P-1 and the row of openings 115, and one or more ICs 130 (e.g., dual-personality communication IC 131 and memory IC 135) and passive components 140 mounted on lower PCB surface 118. PCB 111 is formed in accordance with known PCB manufacturing techniques such that metal contacts 121, IC dies 130, and passive components 140 are electrically interconnected by a predefined network including conductive traces and other conducting structures that are sandwiched between multiple layers of an insulating material (e.g., FR4) and adhesive. For example, contact pads 119-1 and 119-2 are disposed on lower surface 118 and used to connect dual-personality communication IC 131 and memory IC 135, respectively, using methods described below. Contact pads 119-3 are also provided on lower surface 118, and used to facilitate the mounting of passive components 140, as described in additional detail below.

As indicated in FIG. 3(A), according to an aspect of the present invention, spring assembly 120 is mounted onto lower surface 118 of the PCB 111 such that each contact spring 122 extends through a corresponding opening 115 such that a contact portion 124 of each contact spring 122 protrudes from the upper PCB surface 116 in the manner described above with reference to FIG. 1(B). In one embodiment, each contact spring 122 is a substantially C-shaped spring structure having a pair of base portions 123 that are secured to a substrate 125, and a central contact portion 124 that forms an arched (bent) structure extending between base portions 123. By forming the PCBA in this manner, when spring assembly 120 is mounted onto lower surface 118, contact portions 124 extend a suitable distance above upper surface 116, and substrate 125 covers openings 115. As described in further detail below, PCBA 110 is then placed in a mold cavity, and a single-shot molded housing 150 is formed that includes a lower portion 150B formed over lower surface 118 such that ICs 130 and passive components 140 are encased by plastic, and upper portion 150A formed over upper surface 116 of PCB 111, whereby upper portion 150A is formed such that standard USB contacts 121 and contact springs 122 are exposed as described herein by opening 155 and by slots defined between ribs 157. By forming EUSB device 101A in this manner, PCBA 111 is protected on both sides by respective portions of molded housing 150, and final assembly of the EUSB memory card into any of several external housings (see example below) is greatly simplified, which reduces manufacturing costs by simplifying the assembly process.

Housing 150 is molded plastic formed and arranged such that substantially all of the plastic used to form housing 150 is located either below (i.e., on one side of) lower surface 118 of PCB 111, or above upper surface 116 of PCB 111. As indicated in FIG. 3(B), lower housing portion 150B includes a peripheral surface 151 extending downward (i.e., perpendicular to PCB 111), and a planar lower surface 152B that extends parallel to PCB 111. For discussion purposes, the portion of peripheral surface 151 surrounding handle section 112 of PCB 111 is referred to below as handle surface section 151-1, and the section of peripheral surface 151 surrounding plug section 114 of PCB 111 is referred to below as plug surface section 151-2. Similarly, the portion of lower surface 152B covering handle section 112 of PCB 111 is referred to below as handle surface section 152-1B, and the section of lower surface 152B covering plug section 114 of PCB 111 is referred to below as plug cover section 152-2B.

Referring to FIG. 3(A), according to another aspect of the invention, passive components 140 are mounted onto lower surface 118 of PCB 111 using one or more standard surface mount technology (SMT) techniques, and one or more unpackaged IC dies 130 are mounted on PCB 111 using chip-on-board (COB) techniques. During the SMT process, passive components 140, such as resistors, capacitors, and oscillator are mounted onto associated contact pads 119-3 disposed on lower surface 118, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 are unpackaged, semiconductor "chips" that are mounted onto surface 118 and electrically connected to corresponding contact pads using known COB techniques. Passive components 140, IC dies 131 and 135 and metal contacts 121 and 122 are operably interconnected by way of metal traces that are formed on and in PCB 111 using known techniques.

Referring to FIG. 3(B), a thickness T1 and width W1 of connector plug 114 is selected to produce a secure (snug) fit inside either an external case (discussed below) or directly into socket 190 (see FIG. 1). According to another aspect of the present invention, planar upper surface 152A and planar lower surface 152B are parallel to PCB 111, and are spaced such that a first thickness T1 of connector plug 114 (i.e., measured between upper housing surface 152A and lower housing surface 152B adjacent to metal contacts 121) is substantially equal to a second thickness T2 adjacent a rear end of handle section 114. That is, as indicated in FIG. 3(B), EUSB device 101A is substantially flat along its entire length (i.e., measured from the rear edge of handle section 112 to the front edge of plug section 114). In the embodiment shown in FIG. 3(B), the uppermost surface of EUSB device 101A is defined by upper housing surface 152A, which is parallel to planar lower housing surface 152B along the entire length of EUSB device 101A.

According to an aspect of the present invention, the "flatness" associated with modular USB core component 102 is achieved by mounting all of the IC dies ("chips") and other electronic components of modular USB core component 102 on lower surface 118 of PCB 111 (i.e., on the side opposite to metal contacts 121), and forming a thin layer of molding material on upper surface 116. That is, the minimum overall thickness of modular USB core component 102 is determined by the thickness T1 that is required to maintain a snug connection between connector plug 114 and female USB socket connector 190 (see FIG. 1). This arrangement requires that ribs 157 extend a predetermined distance above upper surface 116, and that plug wall section 151-2B plug and lower wall section 152-2B of lower housing portion 150B extend a predetermined distance below PCB 111 such that the distance between upper surface 152A and lower wall section 152-2B provide the required thickness T1. The present inventors have found that the overall thickness of modular USB core component 102 can be minimized by mounting the IC dies 130 and 135 and passive components (e.g., capacitor 142) only on lower surface 118 of PCB 111, and by minimizing the thickness of the upper housing portion 150A such that upper surface 152A is slightly above the surface of metal contact pads 121. That is, if the IC dies and passive components are mounted on upper surface 116, then the overall thickness of the resulting USB structure would be the required thickness T1 plus the thickness that the ICs extend above PCB 111 (plus the thickness of a protective wall, if used).

According to another aspect associated with the embodiment shown in FIG. 3(B), upper surface 116 of PCB 111 in handle section 112 is covered by upper housing portion 150B, thus facilitating the production of EUSB device 101 with a maximum thickness equal to thickness T1 of plug portion 114. That is, because upper housing portion 150A is formed on upper surface 116 with a uniform thickness, and upper surface 152A defines the higher end of required plug structure thickness T1, the overall height of EUSB device 101 is minimized. As indicated in FIG. 3(B), in accordance with feature specifically associated with EUSB device 101, upper housing portion 150A is disposed on upper surface 116, but does not extend over peripheral (side) edge 111P of PCB 111, and peripheral wall 151 (e.g., front edge 151-2 and rear edge 151-1) extends around up to but does not cover peripheral edge 111P of PCB 111.

Figure 4:
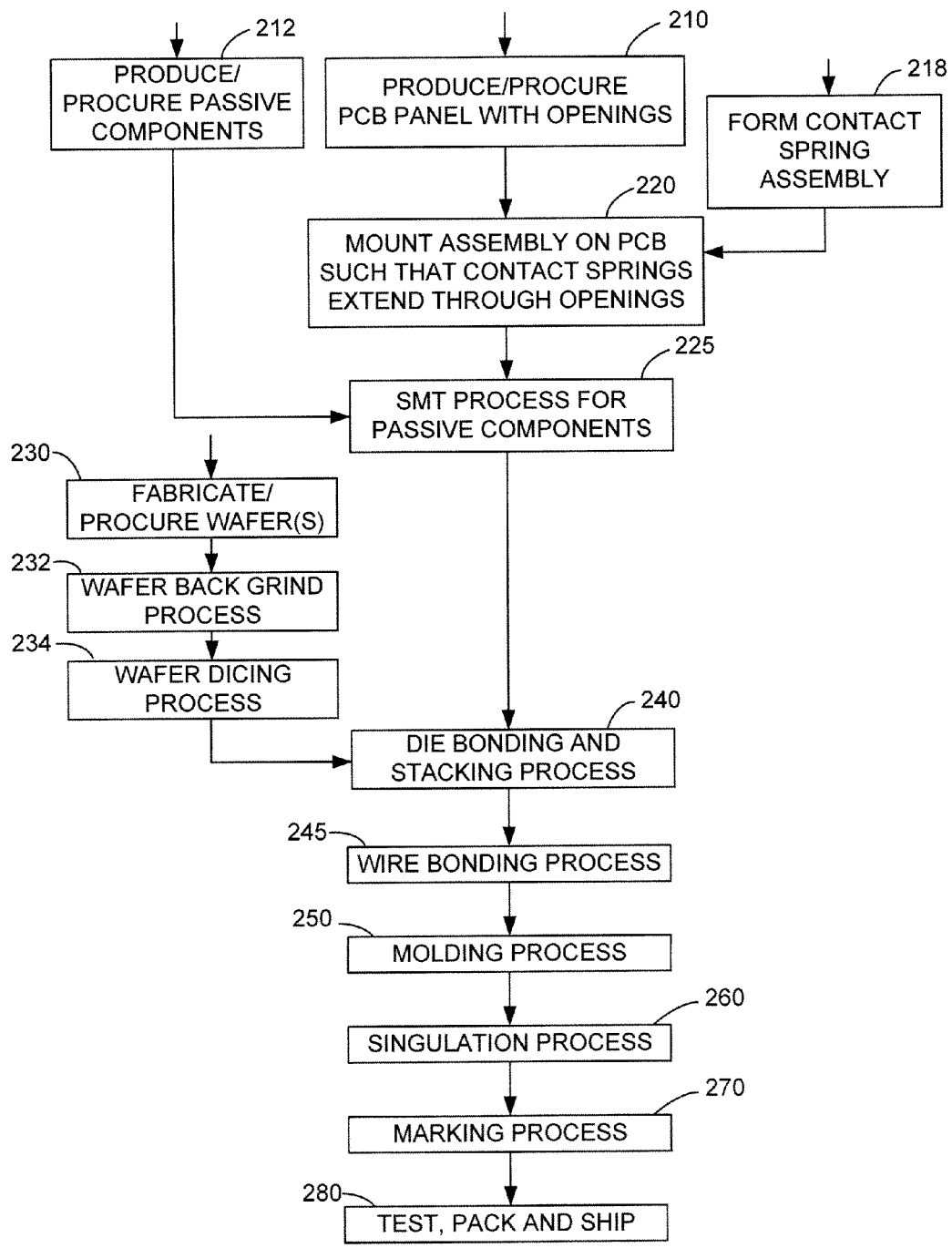
FIG. 4 is a flow diagram depicting a method for producing the extended USB dual-personality extended USB memory card of FIG. 3(A) according to another embodiment of the present invention.

FIG. 4 is a flow diagram showing a method for producing a EUSB memory card according to another embodiment of the present invention. Summarizing the novel method, a PCB panel is fabricated including multiple PCBs, each PCB defining openings (block 210; described below with reference to FIGS. 5 and 6). Contact springs are then mounted onto the PCB panel such that each contact spring extends through a corresponding opening and contact portions of each contact spring protrude above the upper surface of the PCB (block 220; described below with reference to FIGS. 7-10). ICs and passive components are then attached to the PCBs (block 225-245; described below with reference to FIGS. 11-14), and then a single-shot molded housing is formed on the PCB such that the passive components and ICs are covered, and such that substantially all of the PCB's upper surface is exposed.

According to another aspect of the invention, the passive components are then mounted on the PCB panel using SMT techniques (block 225), and then unpackaged IC dies are die bonded and wire bonded onto the PCB panel using COB techniques (block 240). Plastic molding is then performed to form a plastic housing over the PCB panel in a single molding step (single-shot) (block 260), which is then singulated into individual EUSB memory cards (block 260). This portion of the method provides several advantages over conventional manufacturing methods that utilize SMT techniques only. First, by utilizing COB techniques to mount the USB controller and flash memory, the large amount of space typically taken up by these devices is dramatically reduced, thereby facilitating significant miniaturization of the resulting EUSB memory card footprint. Second, by implementing the wafer grinding methods described below, the die height is greatly reduced, thereby facilitating stacked memory arrangements such as those described below. The molded housing also provides greater moisture and water resistance and higher impact force resistance than that achieved using conventional manufacturing methods. In comparison to the standard USB memory card manufacturing that used SMT process, it is cheaper to use the combined COB and SMT (plus molding) processes described herein because, in the SMT-only manufacturing process, the bill of materials such as Flash memory and the EUSB controller chip are also manufactured by COB process, so all the COB costs are already factored into the packaged memory chip and controller chip. Therefore, the combined COB and SMT method according to the present invention provides a less expensive and higher quality (i.e., more reliable) extended USB memory card product with a smaller size than that possible using conventional SMT-only manufacturing methods.

Referring to the lower end of FIG. 4, the EUSB memory cards are marked (block 270), and then tested, packed and shipped (block 280). Optional final assembly is then performed by producing/procuring an external housing, and mounting a EUSB memory card into the external housing.

The flow diagram of FIG. 4 will now be described in additional detail below with reference to the following figures.

Referring to the upper portion of FIG. 4, the manufacturing method begins with filling a bill of materials including producing/procuring PCB panels (block 210), producing/procuring passive (discrete) components (block 212) such as resistors, capacitors, diodes, LEDs and oscillators that are packaged for SMT processing, producing spring assemblies (block 218), and producing/procuring a supply of IC wafers (or individual IC dies; see blocks 230 to 234, discussed below).

Figure 5A:
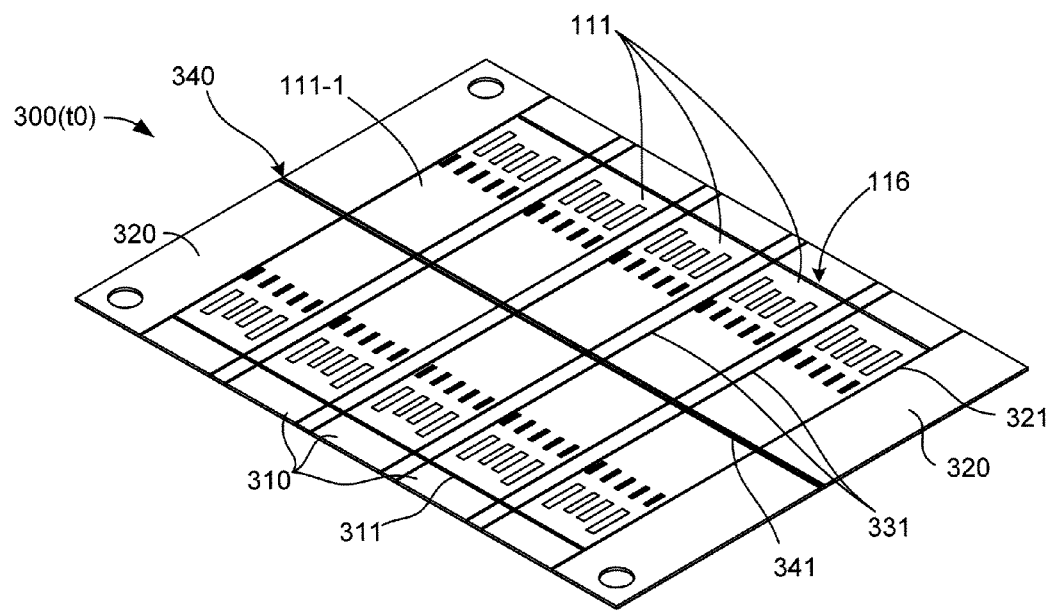
FIGS. 5(A) and 5(B) are top perspective and partial top perspective views showing a PCB panel utilized in the method of FIG. 4.
Figure 5B:
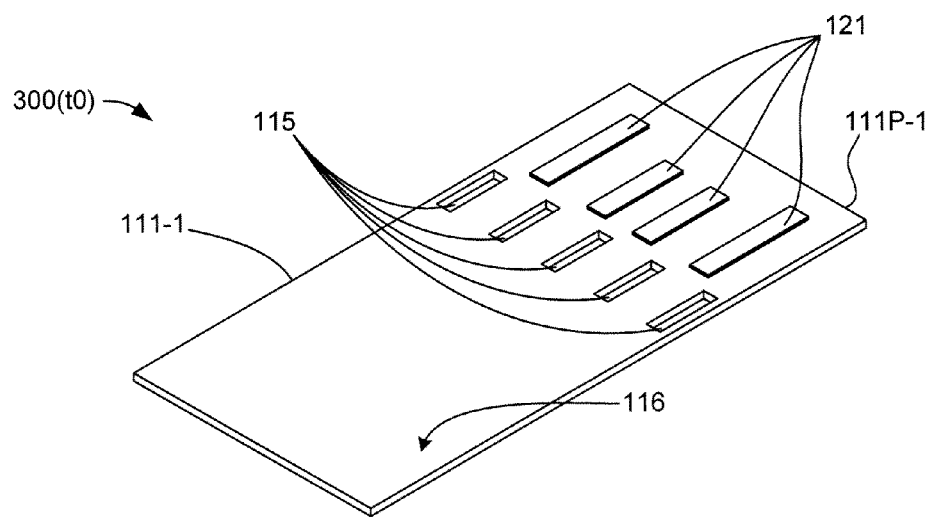
Figure 6A:
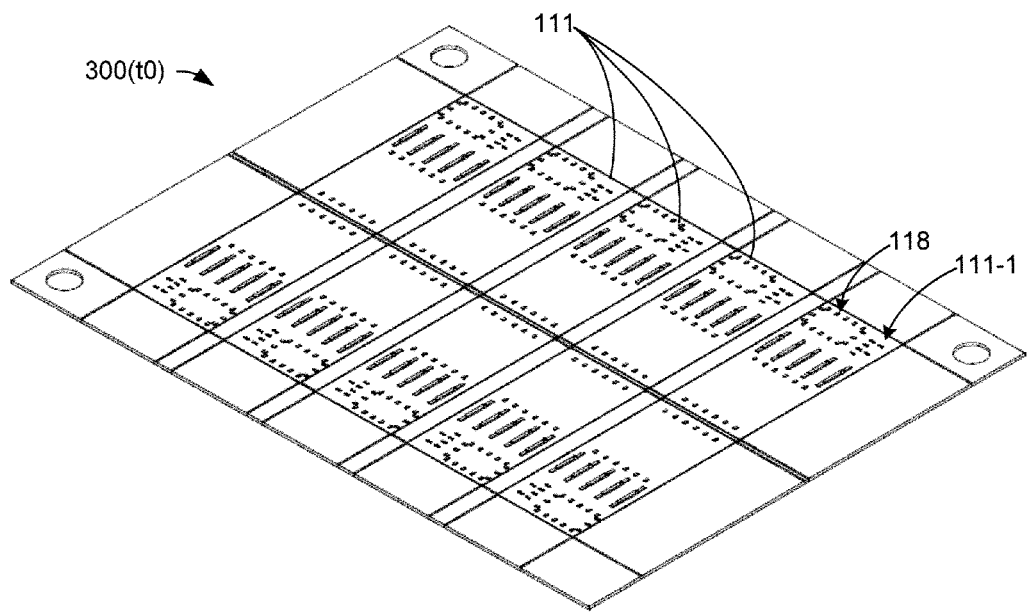
FIGS. 6(A) and 6(B) are bottom perspective and partial bottom perspective views showing the PCB panel of FIG. 5(A)
Figure 6B:
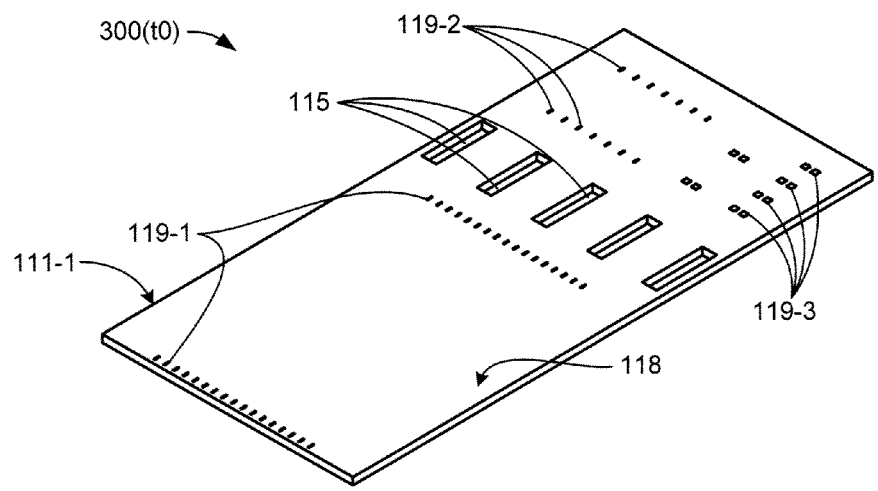

FIG. 5(A) is a top perspective view showing a PCB panel 300(t0) provided in block 210 of FIG. 4 according to a specific embodiment of the present invention. FIG. 5(B) is a top perspective view showing a selected PCB 111-1 of PCB panel 300(t0). FIGS. 6(A) and 6(B) are top perspective views showing panel 300 and selected PCB 111-1, respectively. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional processing.

As indicated in FIGS. 5(A) and 6(A), PCB panel 300(t0) includes a two-by-five matrix of regions designated as PCBs 111, each having the features described above with reference to FIG. 3(A). FIGS. 5(A) and 5(B) show upper surface 116 of each PCB 111 (e.g., upper surface 116 of panel 111-1 includes standard USB metal contacts 121, described above), and FIGS. 6(A) and 6(B) show lower surfaces 118 of PCBs 111 (represented by PCB 111-1 in FIG. 6(B)). Note that lower surface 118 of each PCB 111 (e.g., PCB 111-1) includes multiple contact pads 119-1, 119-2 and 119-3 arranged in predetermined patterns for facilitating SMT and COB processes, as described below.

As indicated in FIG. 5(A), in addition to the two rows of PCBs 111, panel 300(t0) includes end border regions 310 and side border regions 320 that surround the PCBs 111, and a central region 340 disposed between the two rows of PCBs 111. Designated cut lines are scored or otherwise partially cut into PCB panel 300(t0) along the borders of each of these regions, but do not pass through the panel material. For example, end cut lines 311 separate end border panels 310 from associated PCBs 111, side cut lines 321 separate side border panels 310 from associated PCBs 111, and central cut lines 341 separate central region 340 from associated PCBs 111. PCB cut lines 331 are formed along the side edges between adjacent PCBs 111. The border panels are provided with positioning holes and other features known to those skilled in the art to facilitate the manufacturing process, and are removed during singulation (described below).

According to an aspect of the invention, each PCB 111 of panel 300(t0) defines a predetermined number of openings 115 that extend between upper surface 116 and lower surface 118 (e.g., as depicted by FIGS. 5(B) and 6(B)). Openings 115 are in the form of elongated slots that are positioned behind standard USB contacts 121 (i.e., as indicated in FIG. 5(B), standard USB contacts 121 are positioned between openings 115 and front edge 111P-1 of substrate 111-1). As discussed herein openings 115 are utilized in the mounting of contact springs.

Note that PCBs for USB memory cards that are produced using SMT-only manufacturing processes must be significantly wider than PCBs 111 due to the space required to mount already packaged flash memory devices. By utilizing COB methods to mount the flash memory, the present invention facilitates significantly narrower PCBs 111, thereby allowing each PCB panel 300(t0) to include an increased number of PCBs 111 per PCB panel, thereby providing shorter manufacturing times and lower manufacturing costs.

Figure 7A:
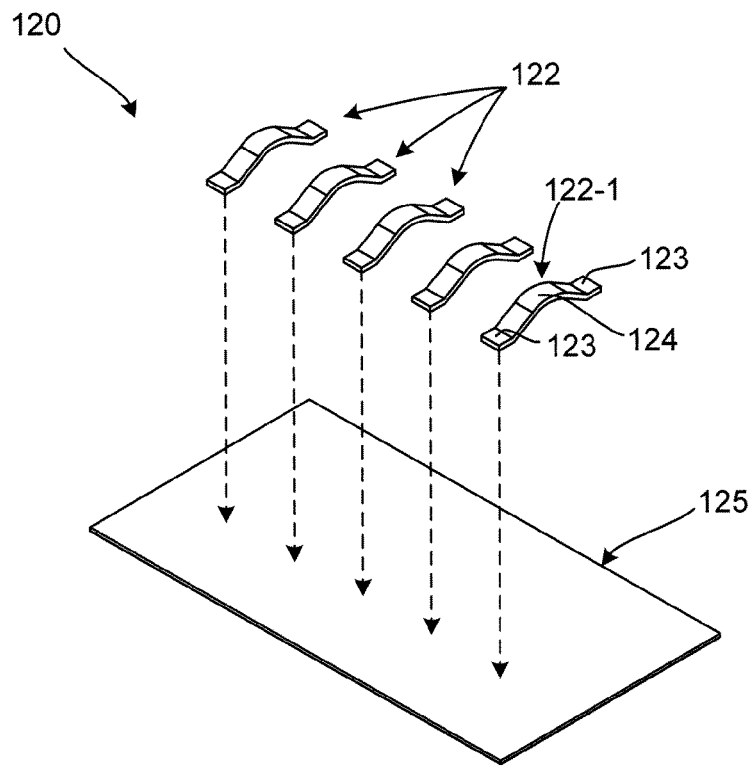
FIGS. 7(A) and 7(B) are exploded perspective and assembled perspective views showing a contact spring assembly utilized in the method of FIG. 4 according to an embodiment of the present invention.
Figure 7B:
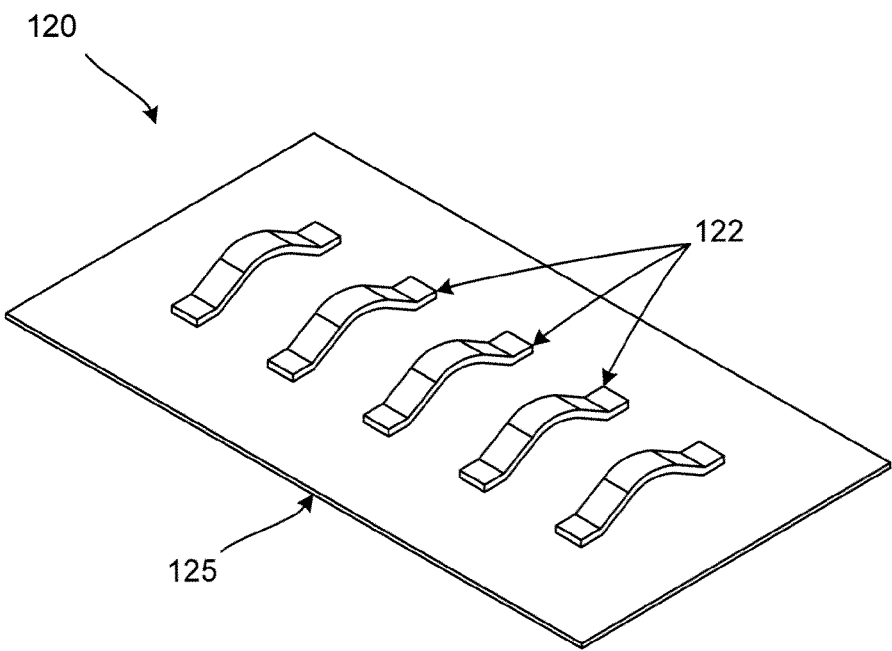
Figure 8A:
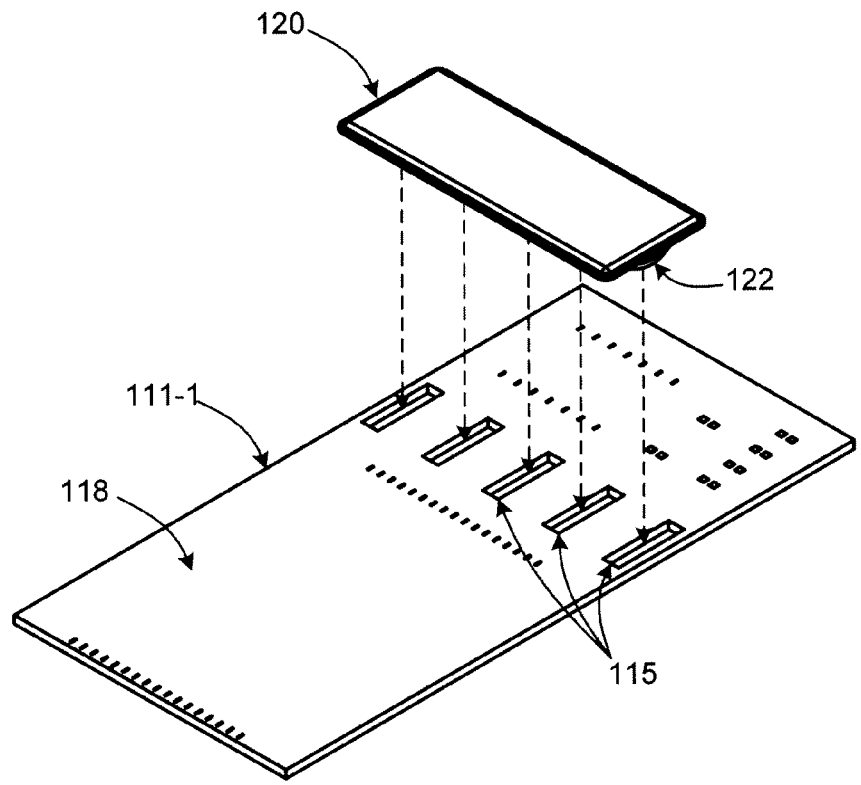
FIGS. 8(A) and 8(B) are top perspective and bottom perspective views depicting mounting of the contact spring assembly of FIG. 7(B) onto the PCB panel of FIG. 5(A) according to an embodiment of the present invention.
Figure 8B:
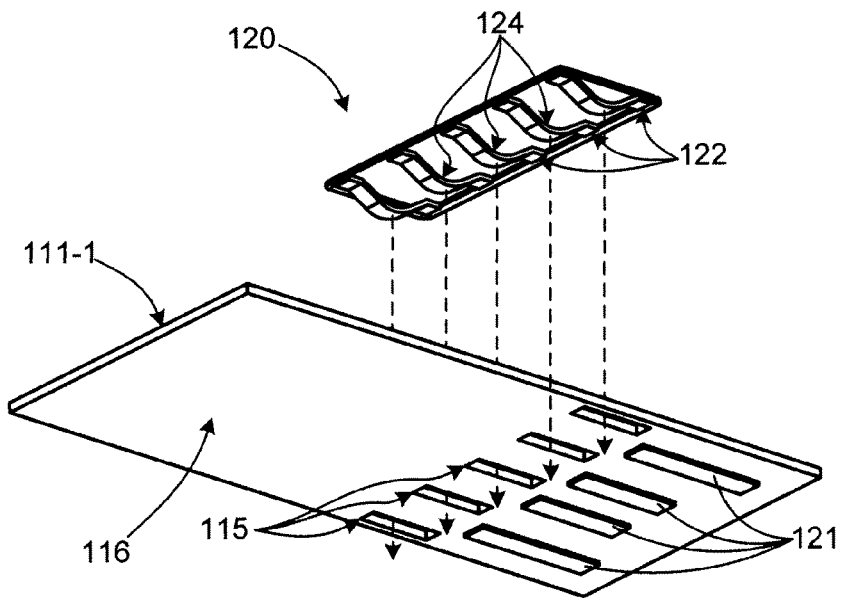
Figure 9A:
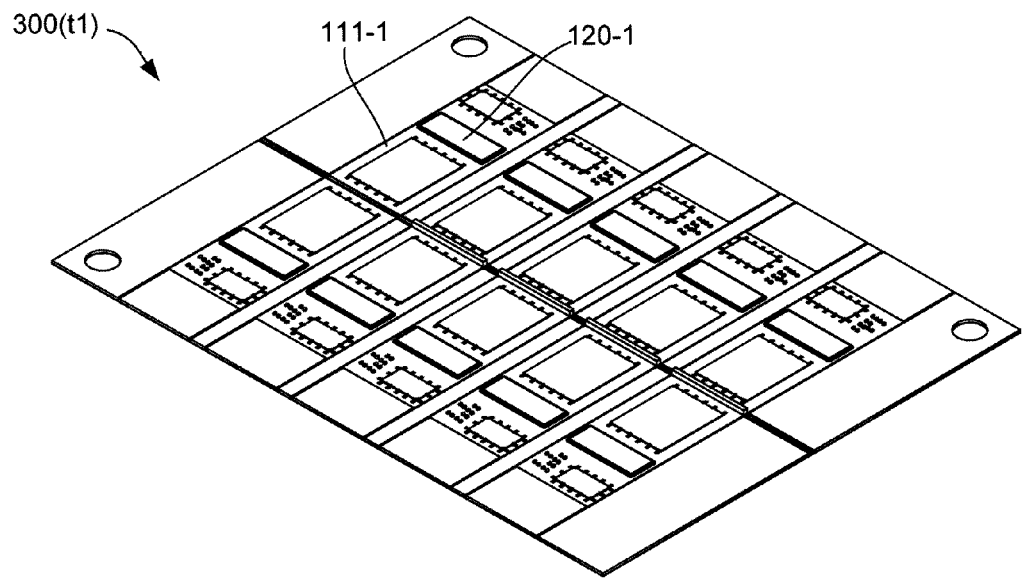
FIGS. 9(A) and 9(B) are bottom perspective and partial bottom perspective views showing the PCB panel of FIG. 5(A) after the contact spring assembly of FIG. 7(B) is mounted thereon.
Figure 9B:
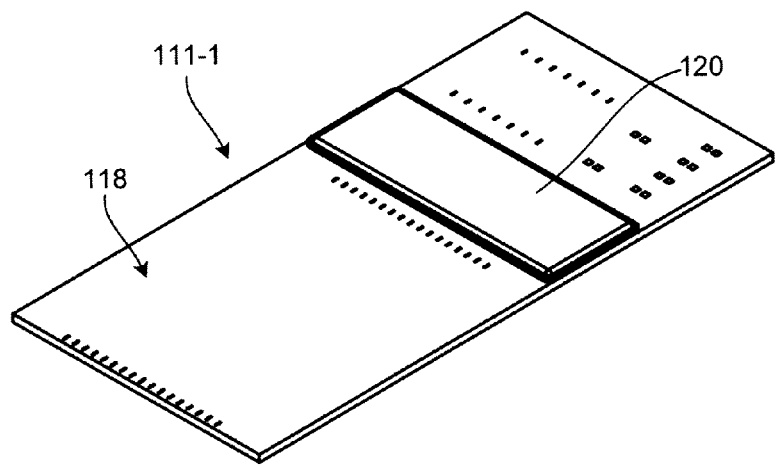
Figure 10A:
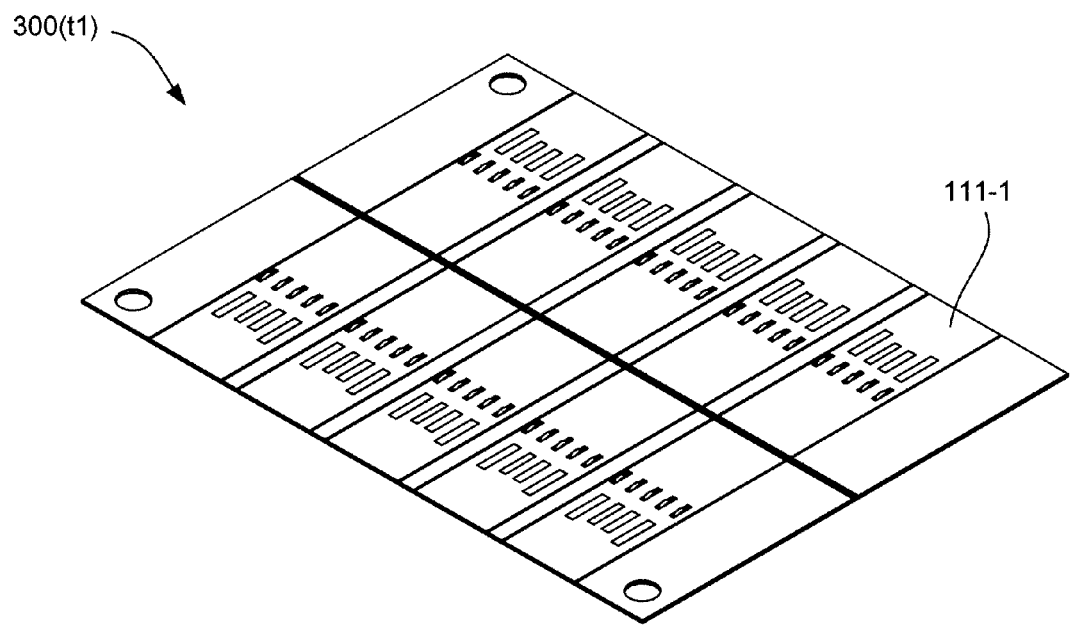
FIGS. 10(A) and 10(B) are top perspective and partial top perspective views showing the PCB panel of FIG. 5(A) after the contact spring assembly of FIG. 7(B) is mounted thereon.
Figure 10B:
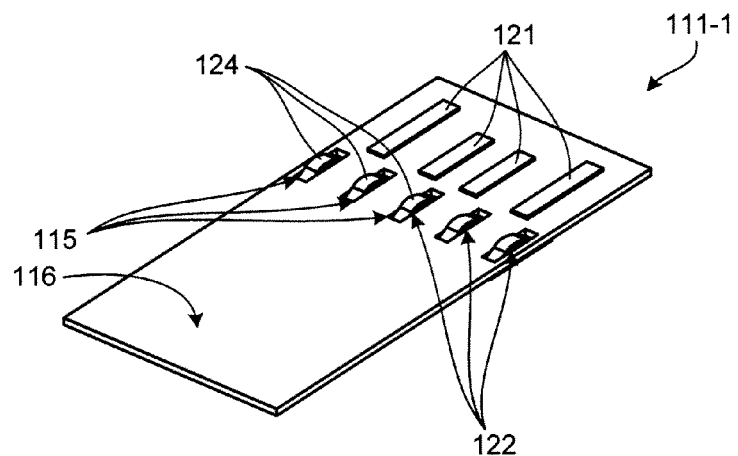

FIGS. 7(A) to 10(B) illustrate the assembly and mounting of spring assemblies onto PCB panel 300(t0) according to an embodiment of the invention. FIGS. 7(A) and 7(B) are exploded perspective and perspective views depicting the formation of a spring assembly 120 according to an embodiment of the present invention. Spring assembly 120 includes five substantially C-shaped contact springs 122 having a pair of base portions 123 that are secured to a substrate 125, and a central contact portion 124 that forms an arched (bent) structure extending between base portions 123 and held away from substrate 125. In one embodiment, substrate 125 is plastic or another non-conducting material), and contact springs 122 are secured by adhesive to substrate 125 in a pattern and spacing that precisely matches the pattern and spacing of openings 115 defined on PCB 111A (discussed above). In one embodiment, both base portions 123 are coated with low temperature (i.e., approximately 160° C.) lead-free solder, and substrate 125 is one-sided adhesive tape of high temperature resistance type (i.e., able to sustain temperatures greater than 180° C.). FIGS. 8(A) and 8(B) are perspective top and bottom views, respectively, illustrating the subsequent process of mounting a spring assembly 120 onto PCB 111-1 of PCB panel 300(t0) (shown in FIG. 6(B)). As indicated, spring assembly 120 is mounted onto PCB 111-1 such that a portion of each contact spring 122 extends through a corresponding elongated slot (opening) 115. To facilitate the transfer of signals between contact springs 122 and the subsequently-mounted IC dies, each contact spring 122 is electrically connected to an associated conductive trace (not shown) formed on PCB 111-1. In one embodiment, metal pads (not shown) are disposed on each PCB 111 at both ends of each slot 115. These pads are connected to the dual-personality communication integrated circuit (IC) 131 electrically (not shown) by way of corresponding traces. These pads are soldered to the top surface of each base portion 123 of each contact spring 122. FIG. 9(A) shows panel 300(t1) after spring assemblies 120 are mounted on each PCB 111 (e.g., spring assembly 120-1 is mounted on lower surface 118 of PCB 111-1, as shown in additional detail in FIG. 9(B)). As indicated in FIGS. 10(A) and 10(B), contact portion 124 of each contact spring 122 protrudes through a corresponding slot 115 and extends above upper surface 116 of each PCB 111 (e.g., PCB 111-1).

Figure 11A:
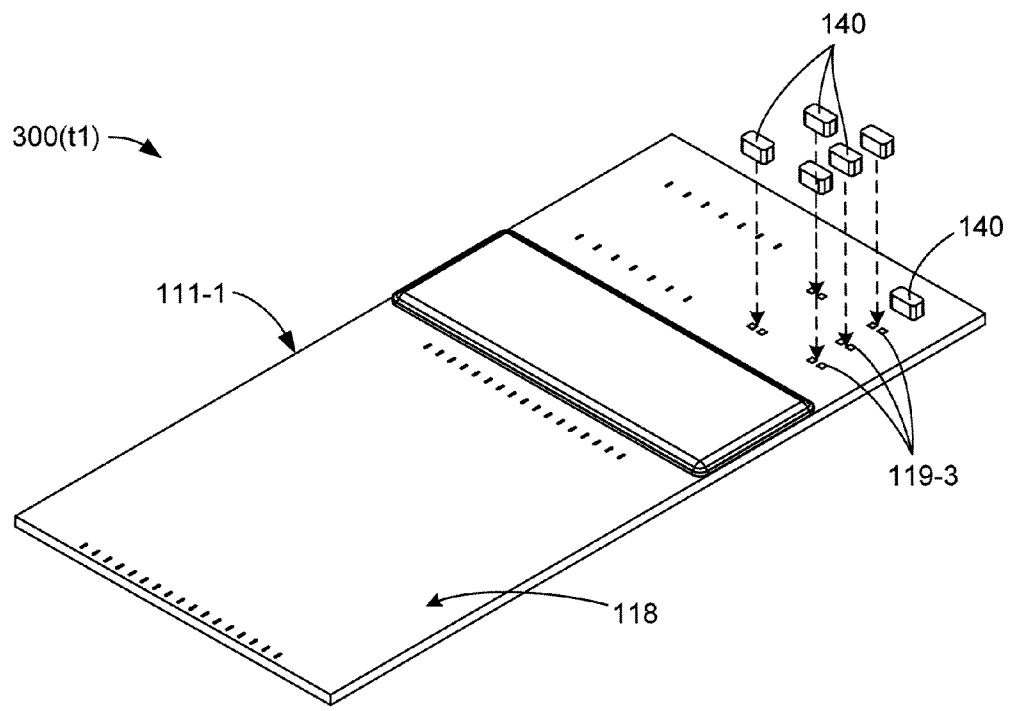
FIGS. 11(A) and 11(B) partial bottom perspective and bottom perspective views showing the PCB panel of FIG. 10(A) during a subsequent SMT process.
Figure 11B:
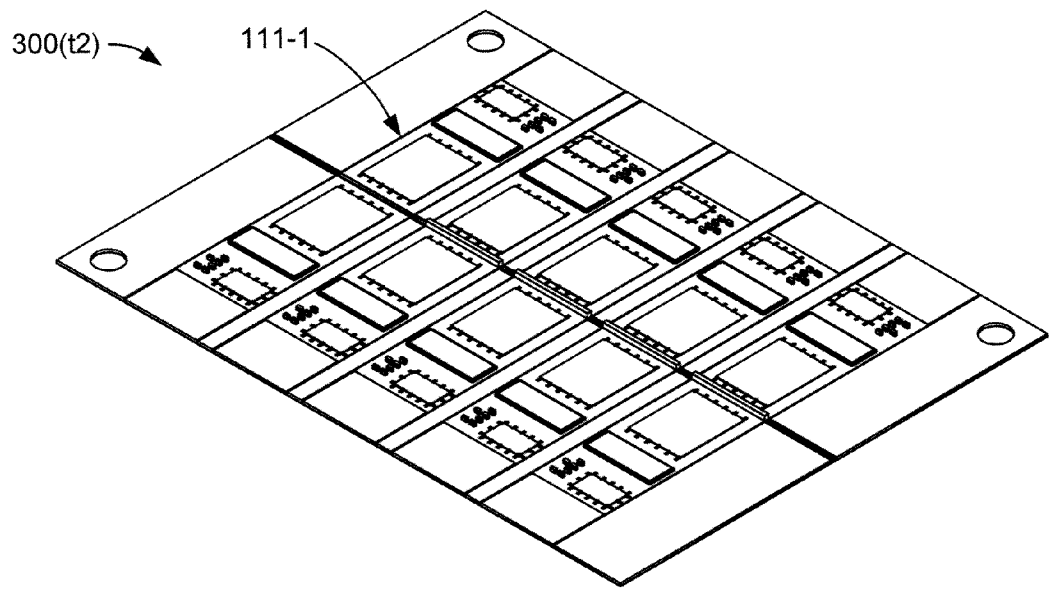

FIG. 11(A) is a perspective view depicting a portion of panel 300(t1) that is used to mount passive components on PCB 111-1 according to block 225 of FIG. 4. During the first stage of the SMT process, lead-free solder paste is printed on contact pads 119-3, which in the present example correspond to SMT components 140, using custom made stencil that is tailored to the design and layout of PCB 111-1. After dispensing the solder paste, the panel is conveyed to a conventional pick-and-place machine that mounts each SMT component 140 onto a corresponding pair of contact pads 119-3 according to known techniques. Upon completion of the pick-and-place component mounting process, the PCB panel is then passed through an IR-reflow oven set at the correct temperature profile. The solder of each pad on the PC board is fully melted during the peak temperature zone of the oven, and this melted solder connects all pins of the passive components to the finger pads of the PC board. FIG. 11(B) shows PCB 111-1 of the resulting PCB panel 300(t2), which now includes passive components 140 mounted thereon by the completed SMT process.

Figure 12A:
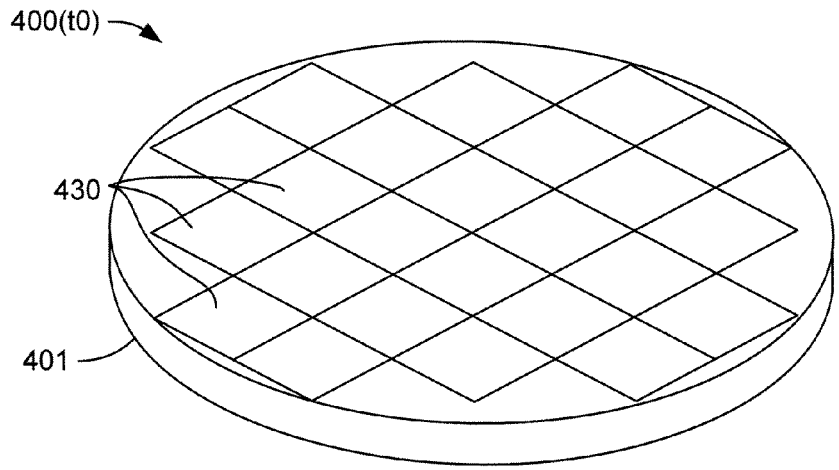
FIGS. 12(A), 12(B), 12(C) and 12(D) are simplified perspective and cross-sectional side views depicting a semiconductor wafer and a process of grinding and dicing the wafer to produce IC dies utilized in the method of FIG. 4.

FIG. 12(A) is a simplified perspective view showing a semiconductor wafer 400(t0) procured or fabricated according to block 230 of FIG. 4. Wafer 400(t0) includes multiple ICs 430 that are formed in accordance with known photolithographic fabrication (e.g., CMOS) techniques on a semiconductor base 401. In the example described below, wafer 400(t1) includes ICs 430 that comprise, e.g., dual-personality communication ICs. In a related procedure, a wafer (not shown) similar to wafer 400(t1) is produced/procured that includes flash memory circuits, and in an alternative embodiment (described in additional detail below), ICs 430 may include both dual-personality communication ICs and flash memory circuits. In each instance, these wafers are processed as described herein with reference to FIGS. 12(B), 12(C) and 12(D).

Figure 12B:
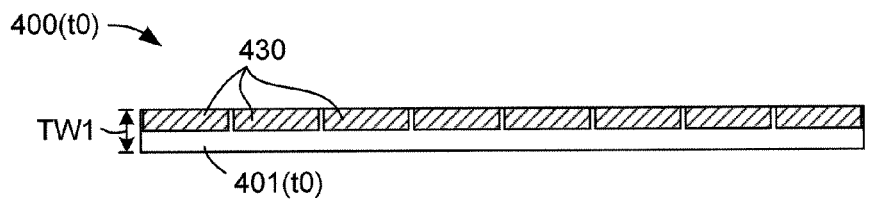
Figure 12C:
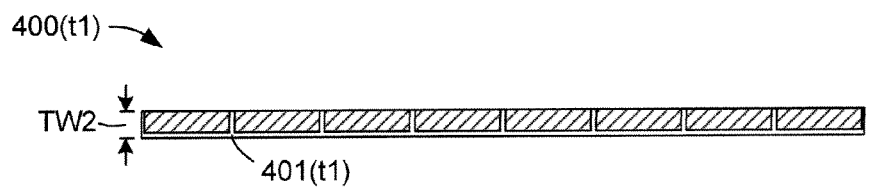

As indicated in FIGS. 12(B) and 12(C), during a wafer back grind process according to block 232 of FIG. 4, base 401 is subjected to a grinding process in order to reduce the overall initial thickness TW1 of each IC 430. Wafer 400(t1) is first mount face down on sticky tape (i.e., such that base layer 401(t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400(t0). The base layer is then subjected to grinding until, as indicated in FIG. 12(C), wafer 400(t1) has a pre-programmed thickness TW2 that is less than initial thickness TW1 (shown in FIG. 12(B)). The wafer is cleaned using de-ionized (DI) water during the process, and wafer 400(t1) is subjected to a flush clean with more DI water at the end of mechanical grinding process, followed by spinning at high speed to air dry wafer 400(t1).

Figure 12D:
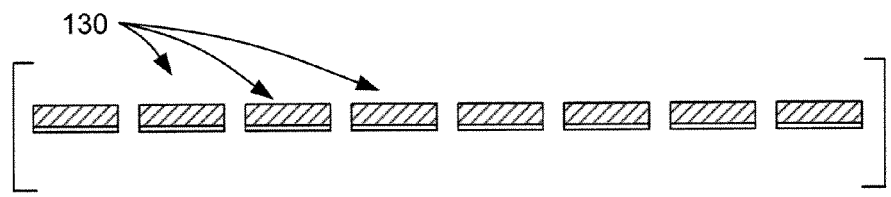

Next, as shown in FIG. 12(D), the wafer is diced (cut apart) along predefined border regions separating ICs 430 in order to produce IC dies 130 according to block 234 of FIG. 4. After the back grind process has completed, the sticky tape at the front side of wafer 400(t1) is removed, and wafer 400(t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed.

Figure 13A:
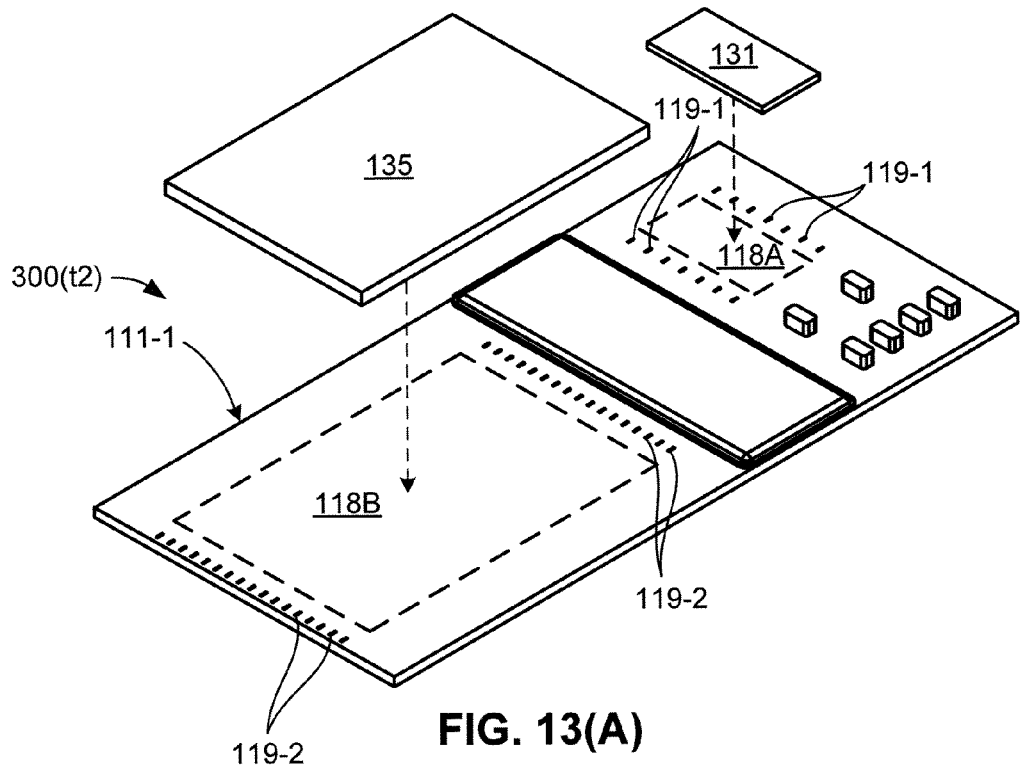
FIGS. 13(A) and 13(B) are partial bottom perspective and bottom perspective views depicting a die bonding process utilized to mount the IC dies of FIG. 12(D) onto the PCB panel of FIG. 11(B) according to the method of FIG. 4.
Figure 13B:
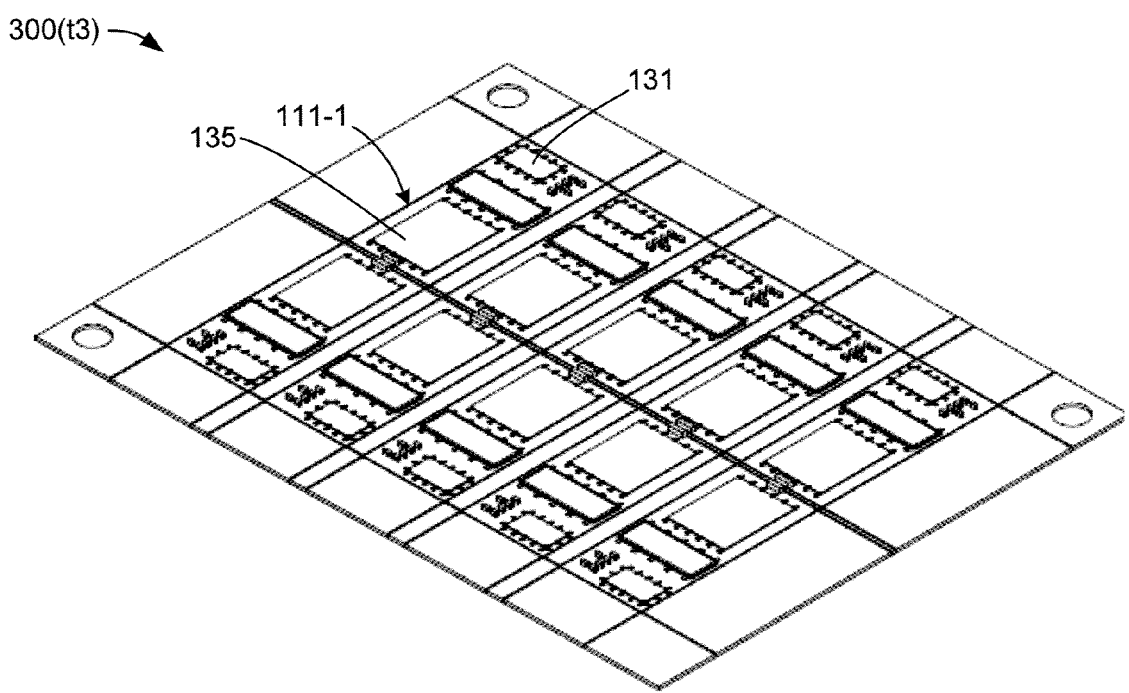

FIG. 13(A) is a perspective view depicting a die bonding process utilized to mount IC dies 131 and 135 on PCB 111-1 of the PCB panel 300(t2) (described above with reference to FIG. 11(B)) according to block 240 of FIG. 5. The die bonding process generally involves mounting IC dies 131 into lower surface region 118A, which is surrounded by contact pads 119-1, and mounting IC die 135 into lower surface region 118B, which is surrounded by contact pads 119-2. In one specific embodiment, an operator loads IC dies 131 and 135 onto a die bonder machine according to known techniques. The operator also loads multiple PCB panels 300(t2) onto the magazine rack of the die bonder machine. The die bonder machine picks the first PCB panel 300(t2) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 118A and 118B of each of the PCB 111 of PCB panel 300(t2). When all PCBs 111 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 131 and bonds it onto area 118A, where epoxy has already dispensed for the bonding purpose, and this process is then performed to place IC die 135 into region 118B. Once all the PCB boards 111 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 13(B) is a top perspective views showing PCB 111-1 of PCB panel 300(t3) after the die bonding process is completed.

Figure 14A:
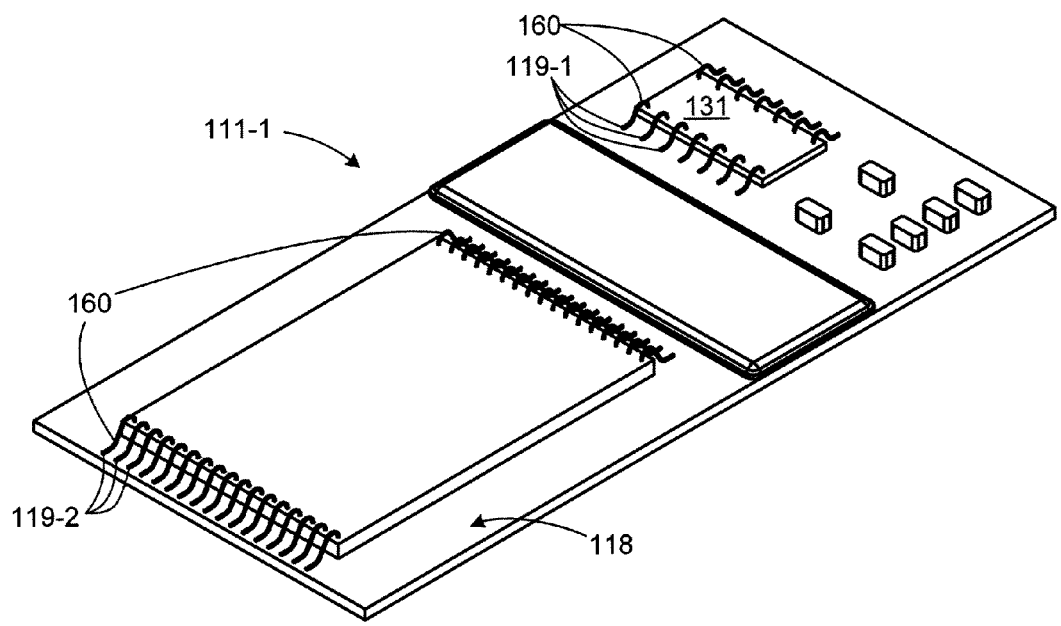
FIGS. 14(A) and 14(B) are partial bottom perspective and bottom perspective views depicting a wire bonding process utilized to connect the IC dies to corresponding contact pads disposed on the PCB of FIG. 13(B) according to the method of FIG. 4.
Figure 14B:
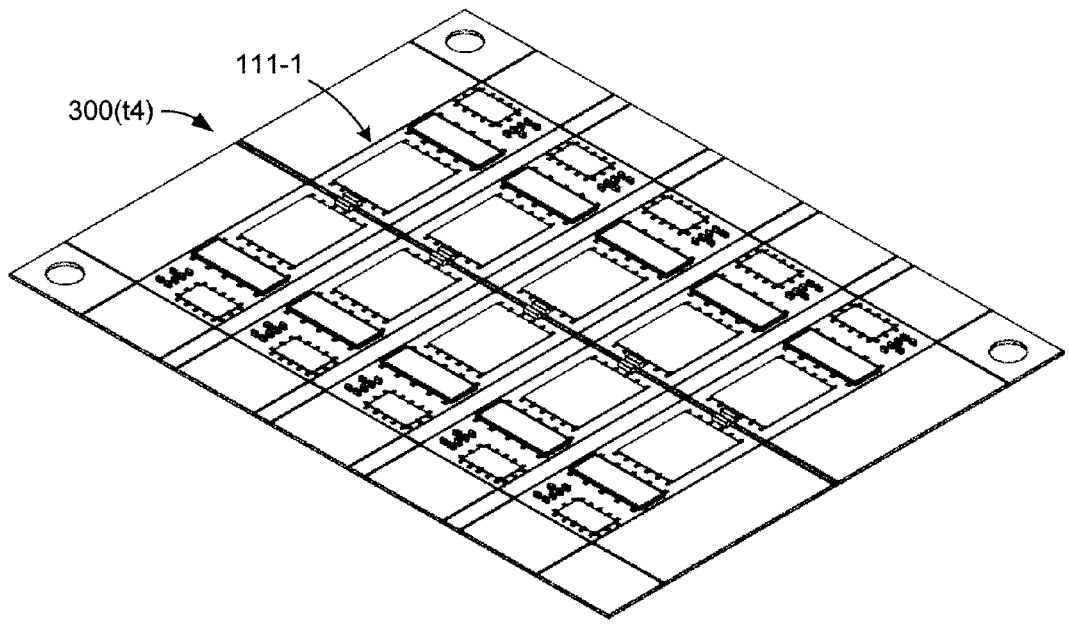

FIG. 14(A) is a perspective view depicting a wire bonding process utilized to connect the IC dies 131 and 135 to corresponding contact pads 119-1 and 119-2, respectively, according to block 245 of FIG. 4. The wire bonding process proceeds as follows. Once a full magazine of PCB panels 300(t3) (see FIG. 13(B)) has completed the die bonding operation, an operator transports the PCB panels 300(t3) to a nearby wire bonder (WB) machine, and loads the PCB panels 300(t3) onto the magazine input rack of the WB machine. The WB machine is pre-prepared with the correct program to process this specific EUSB memory card. The coordinates of all the ICs' pads 119-1 and 119-2 and PCB gold fingers were previously determined and programmed on the WB machine. After the PCB panel with the attached dies is loaded at the WB bonding area, the operator commands the WB machine to use optical vision to recognize the location of the first wire bond pin of the first memory die of the first PCB on the panel. Once the first pin is set correctly, the WB machine can carry out the whole wire bonding process for the rest of the panels of the same product type automatically. For multiple flash layer stack dies, the PCB panels may be returned to the WB machine to repeat wire bonding process for the second stack. FIG. 14(B) is a top perspective views showing PCB panel 300(t4) after the wire bonding process is completed.

Figure 15:
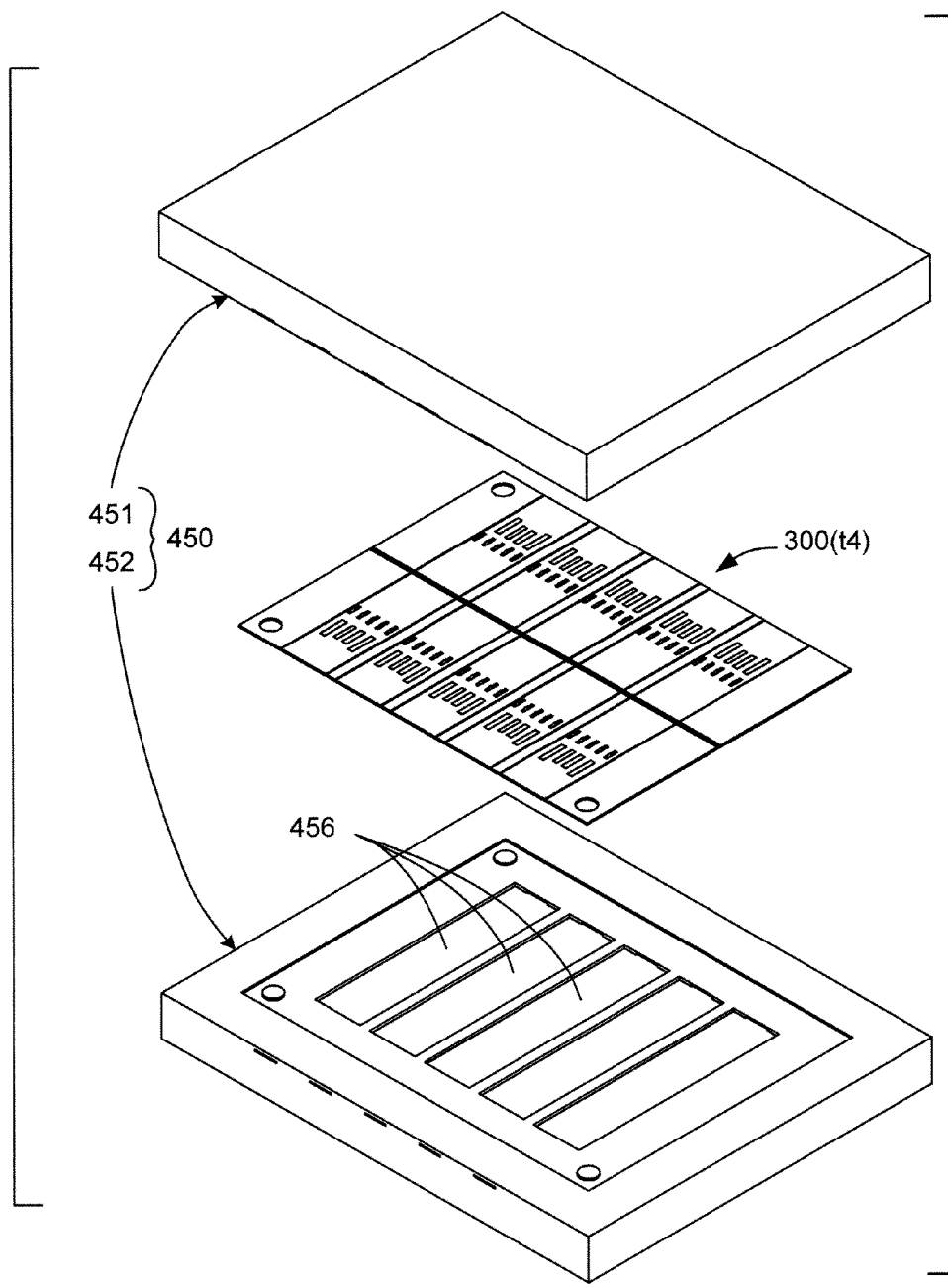
FIG. 15 is an exploded perspective view showing an exemplary molding die assembly utilized to the perform single shot molding process in accordance with the method of FIG. 4.
Figure 16A:
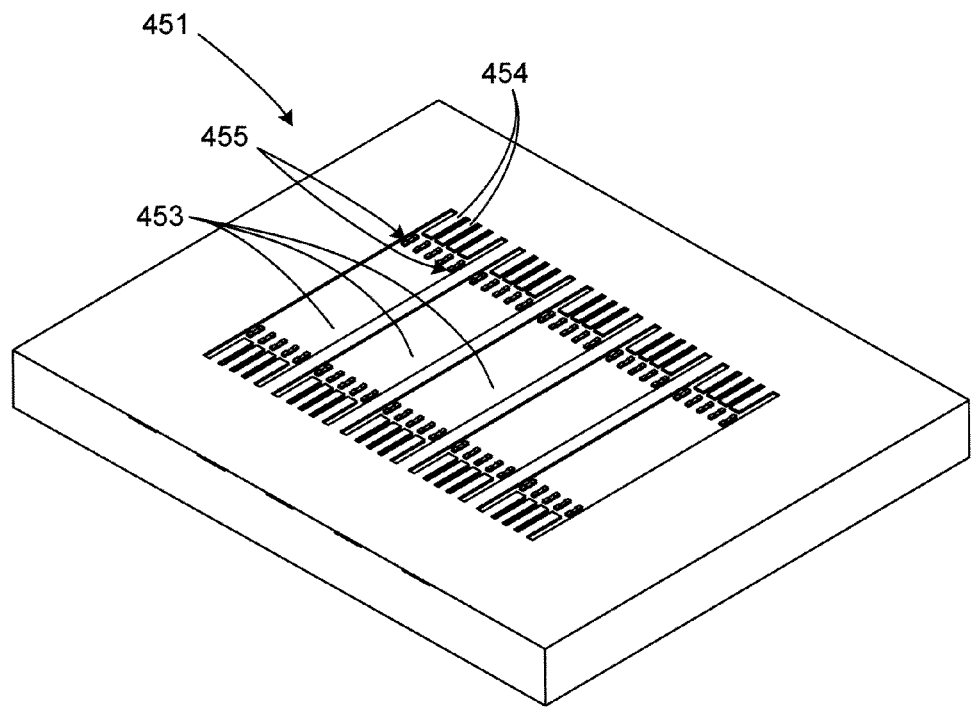
FIGS. 16(A) and 16(B) are perspective and enlarged perspective views, respectively, showing an upper mold die of the molding die assembly of FIG. 15 according to another embodiment of the present invention.
Figure 16B:
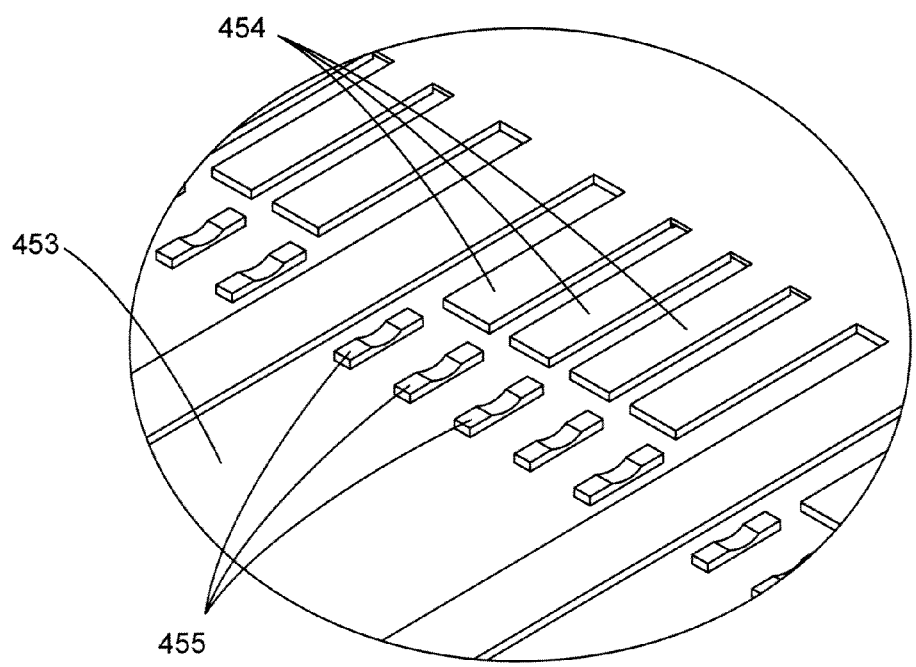

FIG. 15 is an exploded perspective top view showing a top cover plate (upper molding die) 451 and bottom cover plate (lower molding die) 452 of a mold machine 450 utilized to perform a single-shot molding process according to an embodiment of the present invention, and FIGS. 16(A) and 16(B) are bottom perspective views showing the top cover plate 451 in additional detail. FIGS. 17(A) and 17(B) are simplified cross-sectional side views depicting a molding process for forming a molded housing layer over PCB panel 300(t4) using mold machine 450 according to block 250 of FIG. 4.

As indicated in FIG. 15, after the wire bonding process is completed, USB panel 300(t4) is loaded into mold machine 450 between top cover plate 451 and bottom cover plate 452. Top cover plate 451 mounts onto the upper side of PCB panel 300(t4), and as shown in FIGS. 16(A) and 16(B), defines several cavities 453, each having portions disposed over upper surfaces 116 of adjacent pairs of PCB regions 111. In accordance with an aspect of the invention, top cover plate 451 includes parallel bars 454 and protrusions (poles) 455 that are disposed each portion of cavity 453, and that respectively abut contact pads 121 and contact springs 122 when top cover plate 451 is mounted over PCB panel 300(t4) in order to prevent the formation of molding material on these contact structures. In contrast, as shown in FIG. 15, bottom cover plate 452 mounts onto the lower side of PCB panel 300(t4), and defines cavities 456 that respectively cover lower surfaces 118 of adjacent pairs of PCB regions 111 such that the IC chips, wire bonds and passive components that are mounted on lower surface 118 of each PCB are received inside a corresponding cavity 456.

Figure 18A:
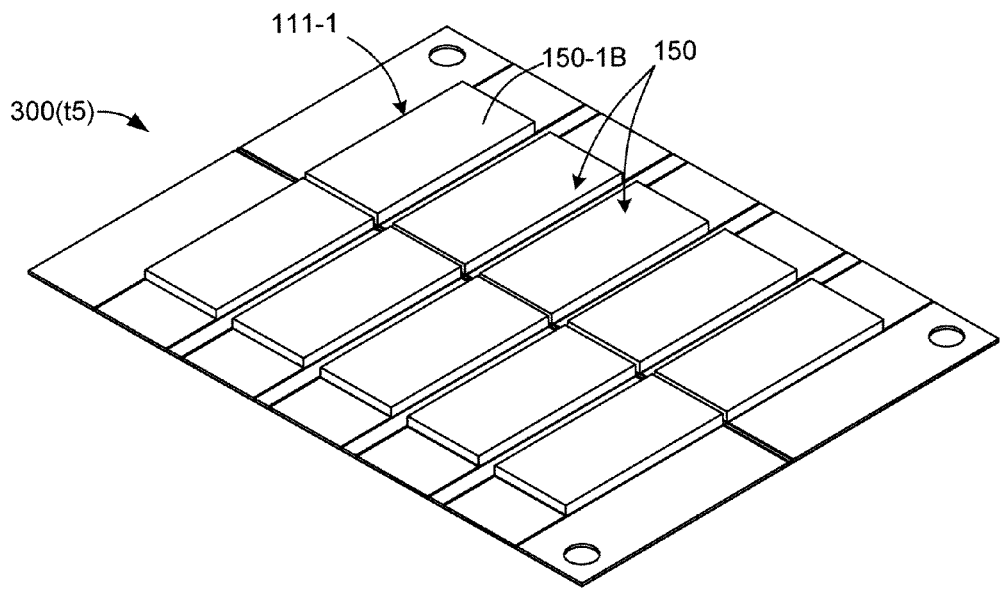
FIGS. 18(A) and 18(B) are bottom and top perspective views, respectively, showing the PCB panel of FIG. 16(B) after being removed from the molding die assembly.
Figure 18B:
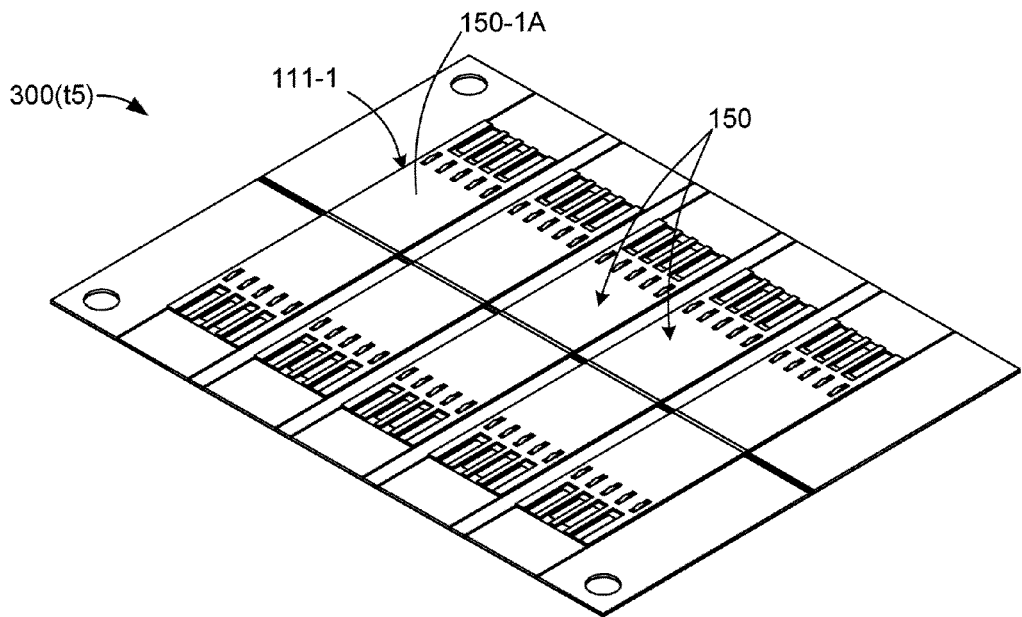

FIGS. 17(A) and 17(B) depict a transfer molding process performed after cover plates 451 and 452 are secured over panel 300(t4). Transfer molding is used due to the high accuracy of transfer molding tooling and low cycle time. The molding material in the form of pellet is preheated and loaded into a pot or chamber (not shown). FIG. 17(A) shows panel 300(t4) secured between cover plates 451 and 452 of mold machine 450 such that each parallel bar 454 is pressed against a corresponding contact pad 121, each protrusion 455 covers a corresponding opening 115, mold cavities 453 are disposed over remaining sections of upper surface 116 onto which molding material is to be formed, and mold cavities 456 are disposed over ICs 130 and 135 and over the remaining structures disposed on lower surface 116 onto which molding material is to be formed. As depicted in FIG. 17(B), a plunger (not shown) is then used to force the material from the pot through channels known as a spruce and runner system into the mold cavities 453 and 456, causing the molten (e.g., plastic) material to form molded housing portions 150A and 150B over each PCB that encapsulates all the IC chips and components disposed on lower surface 118, and to cover selected portions of upper surface 116. Note that parallel bars 454 and protrusions 455 serve to prevent molding material from forming on contact pads 121 and contact springs 122 during the molding process. In addition, substrates 125 (discussed above) cover openings 115 through each PCB region 111, thereby preventing molten plastic from entering openings 115 from cavity 456 and forming on contact springs 122, which could prevent electrical connection when inserted into a host female socket. Mold machine 450 remains closed as the material is inserted and filled up all vacant in cavities 453 and 456. During the process, the walls of cover plates 451 and 452 are heated to a temperature above the melting point of the mold material, which facilitates a faster flow of material through cavities 453 and 456. Mold machine 450 remains closed until a curing reaction within the molding material is complete. A cooling down cycle follows the injection process, and the molding materials of molded casings 150 start to solidify and harden. Ejector pins push PCB panel 300(t5) (shown in FIGS. 18(A) and 18(B)) from the mold machine once molded casings 150 have hardened sufficiently over the PCBs (e.g., lower housing portion 150-1B (FIG. 18(A)) and upper housing portion 150-1A (FIG. 18(B)) are solidified on PCB 111-1).

Figure 19:
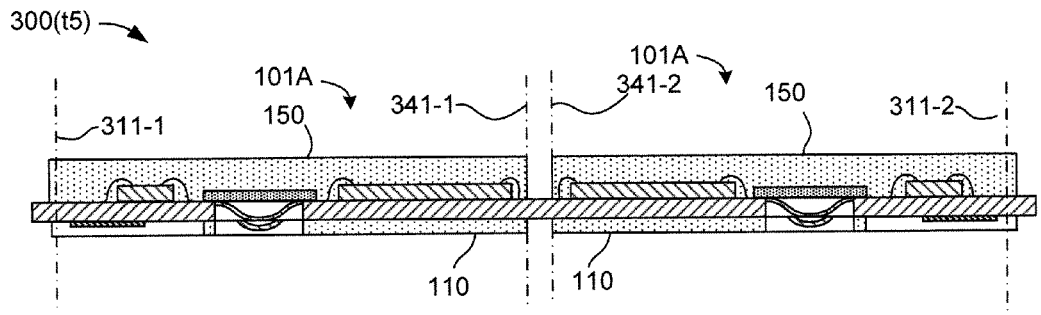
FIG. 19 is a cross-sectional side view showing a singulation process according to the method of FIG. 4.

FIG. 19 is simplified cross-sectional side view depicting a singulation process according to block 260 of FIG. 4 that is used to separate PCB panel 300(t5) into individual sub-assemblies 101A. PCB panel 300(t5) is loaded into a saw machine (not shown) that is pre-programmed with a singulation routine that includes predetermined cut locations. The saw blade is aligned to the first cut line (e.g., end cut line 311-1) as a starting point by the operator. The coordinates of the first position are stored in the memory of the saw machine. The saw machine then automatically proceeds to cut up (singulate) the USB panel 300(t5), for example, successively along cut lines 311-1, 341-1, 341-2, and 311-2, and then along the side cut lines and PCB cut lines (see FIG. 5(A)) to form individual sub-assemblies 101A, which are shown and described above with reference to FIGS. 3(A) and 3(B), according to the pre-programmed singulation routine. Note that, as shown in FIG. 3(B), due to the singulation process which includes cutting along all four sides of each PCB region, the peripheral surface 111P of each PCB 111 is exposed in the final product (i.e., all of the molding material forming upper housing portion 150A is disposed above PCB 111, and all molding material forming lower housing portion 150B is disposed below PCB 111).

Figure 20A:
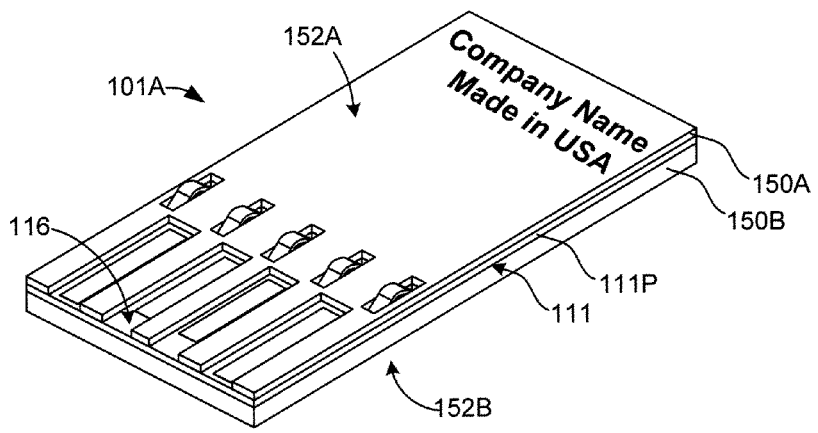
FIGS. 20(A) and 20(B) are top and bottom perspective views showing a EUSB following a marking process according to an embodiment of the present invention.
Figure 20B:
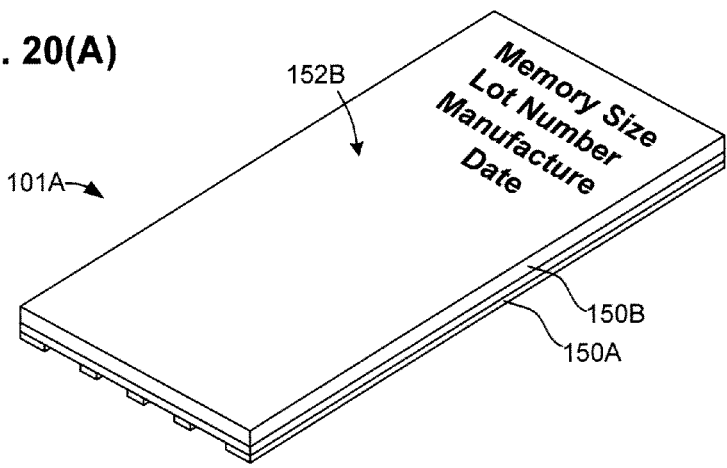

Referring to block 280 located at the bottom of FIG. 4, final procedures in the manufacturing method of the present invention involve optional marking (block 270), testing, packing and shipping the individual extended USB memory cards. An exemplary marked EUSB device 101A is shown in FIGS. 20(A) and 20(B), including company name and country of manufacture printed on upper surface 152A of upper housing portion 150A, and additional information, such as memory size (storage capacity), lot number and manufacturing date printed on lower surface 152B of lower housing portion 150B. Visually or/and electrically test rejects are removed from the good population as defective rejects. The good extended USB memory cards are then packed into custom made boxes which are specified by customers. The final packed products will ship out to customers following correct procedures with necessary documents.

Figure 21:
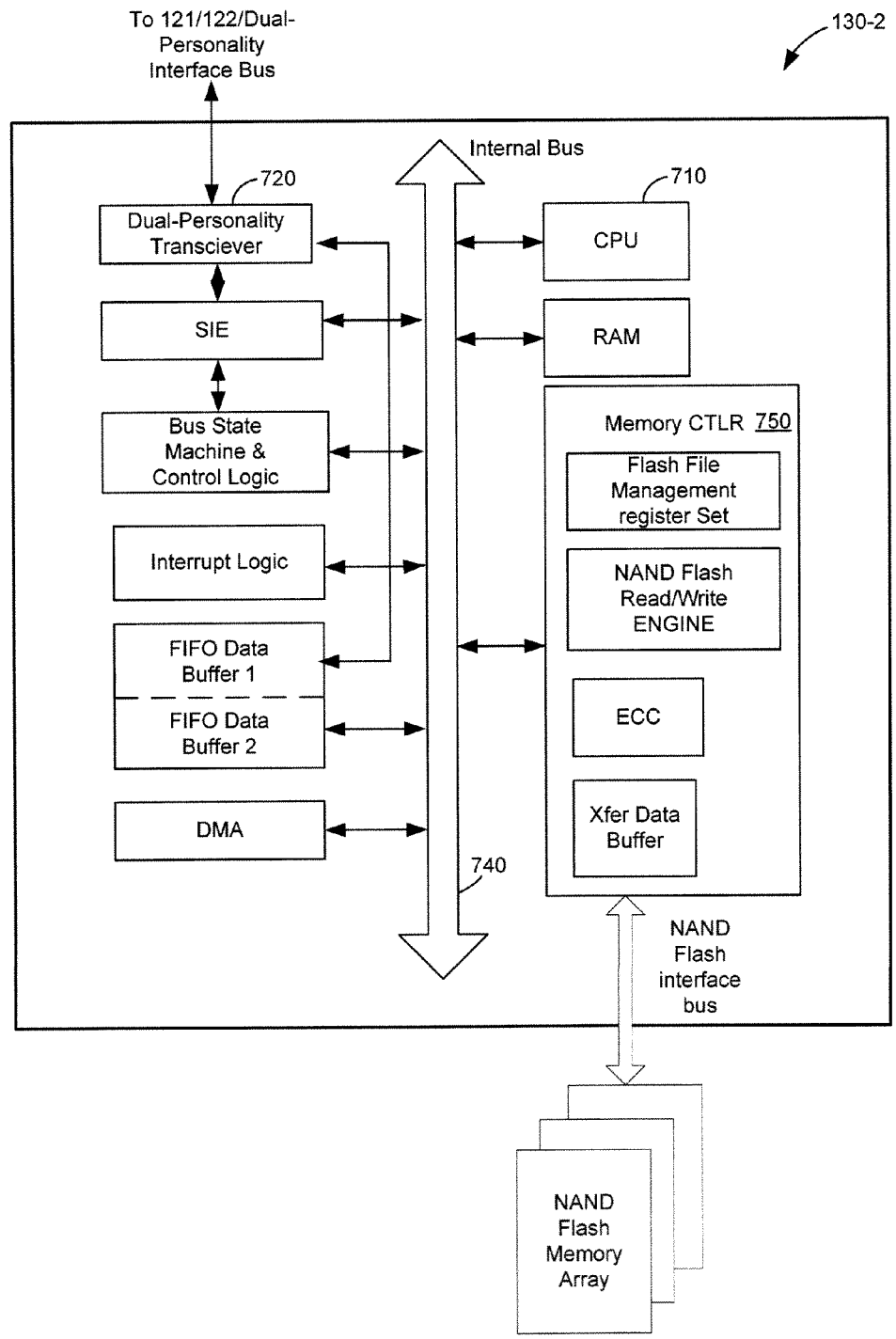
FIG. 21 is a block diagram showing a dual-personality controller circuit of a EUSB memory card according to an embodiment of the present invention.

FIG. 21 is a block diagram showing a simplified dual-purpose controller 130-2 according to another embodiment of the present invention. CPU 710 communications with a dual-personality transceiver 720 by way of an internal bus 740. Dual-personality transceiver 720 operates in a manner similar to that described above with reference to host system 105 (FIG. 2) to communicate with both standard USB contact pads 121 and extended purpose contact springs 122 in order to communicate with a host system, e.g., by way of socket 190 (see FIG. 2). Note that controller 130-2 includes a memory controller 750 for controlling read/write operations to flash memory circuits that are part of the PCBA hosting dual-purpose controller 130-2, thereby facilitating the dual-personality (i.e., EUSB-type and USB-type) communications that are described above.

Figure 22:
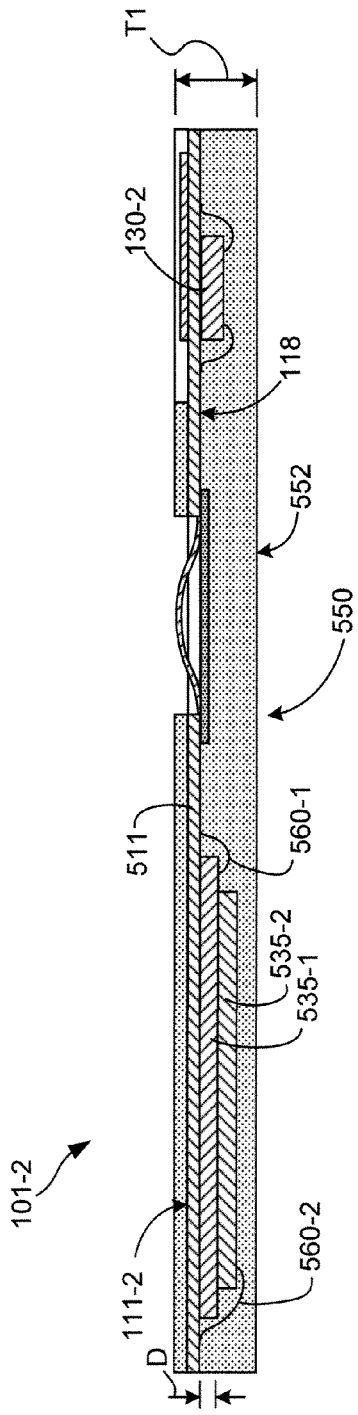
FIG. 22 is simplified cross-sectional side view showing an EUSB memory card including stacked-memory according to another embodiment of the present invention.

FIG. 22 is simplified cross-sectional side view showing a stacked-memory EUSB device 101-2 in which dual-purpose controller 130-2 accesses a first flash memory chip 535-1 and a second flash memory chip 535-2. First flash memory chip 535-1 is mounted on a lower surface 118 of a PCB 111-2 and connected by first wire bonds 560-1 to PCB 111-2 in the manner described above. Because the IC die height (thickness) D is much smaller than packaged flash memory devices, and because the thickness T1 of EUSB memory card 500 is set, for example, at 2.0 mm to assure a snug fit of the extended USB memory card inside a female USB socket (e.g., socket 190, shown in FIG. 1(A)), the present invention facilitates a stacked memory arrangement in which second flash memory die 535-2 is mounted on first flash memory die 535-1 and connected to PCB 111-2 by way of second wire bonds 560-2. In an alternative embodiment (not shown), second flash memory die 535-2 may be connected to contacts provided on first flash memory die 535-1 by associated wire bonds. This stacked memory arrangement greatly increases memory capacity of the extended USB memory cards without increasing the footprint (i.e., thickness T1, length and width) of EUSB device 101-2. EUSB device 101-2 is then processed and assembled as described above to produce a corresponding completed extended USB memory card.

Figure 23:
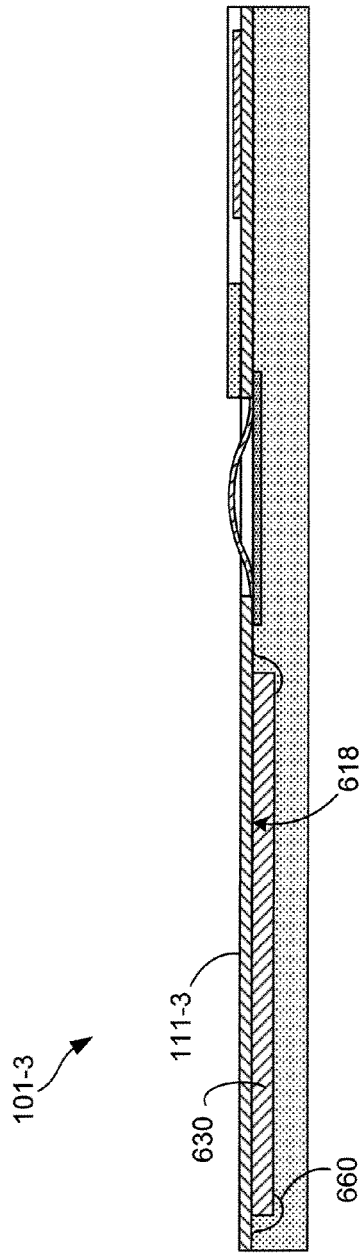
FIG. 23 is simplified cross-sectional side view showing a single-chip EUSB memory card according to another embodiment of the present invention.

FIG. 23 is simplified cross-sectional side view showing a EUSB device 101-3 including stacked-memory according to another embodiment of the present invention. EUSB device 101-3 is distinguished over the previous embodiments in that, instead of separate controller and flash memory chips, EUSB device 101-3 utilizes a single-chip dual-purpose controller/flash die 630 that is connected to a PCB 111-3 by way of wire bonds 660 in the manner described above, and is characterized in that single-chip dual-purpose controller/flash die 630 includes both a dual-purpose controller circuit and one or more flash block mass storage circuits that are interconnected by a bus.

Although the present invention is described above with reference to a specific EUSB device, the two-sided single-shot molding process of the present invention may be utilized to produce other devices as well, some of which are described below with reference to FIGS. 25 to 29.

Figure 24:
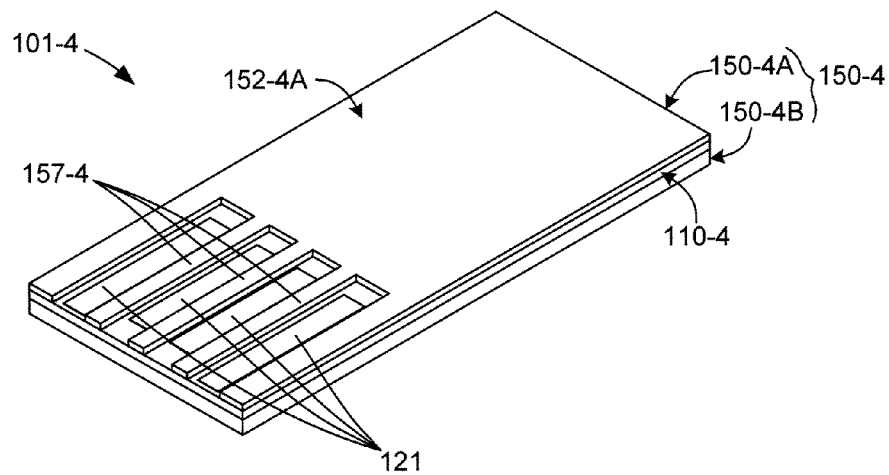
FIG. 24 is a perspective view showing a "standard" type USB device including a molded housing formed in accordance with a modified single-shot molding process according to another embodiment of the present invention.

FIG. 24 is a perspective view showing a USB device 101-4 including a PCBA 110-4 sandwiched between an upper housing portion 150-4A and a lower housing portion 150-4B, which make up a single-shot molded housing 150-4 formed in the manner similar to that described above (i.e., such that lower molding portion 150B covers at least IC disposed on the lower side of PCBA 110-4). In addition, similar to the above-described embodiments, first housing portion 150A includes a several elongated ribs 157 extending between associated pairs of metal contact pads 121. However, USB device 101-4 differs from the previous EUSB embodiments in that PCBA 110-4 does not include a row of metal contact springs disposed behind "standard" USB contacts 121, and the controller IC (not shown) of USB device 101-4 is simplified to perform only "normal" USB communication processes with a host system. Thus, USB device 101-4 illustrates the case where the single-shot molding process and associated ribs can be implemented in a "standard" type USB device.

Figure 25:
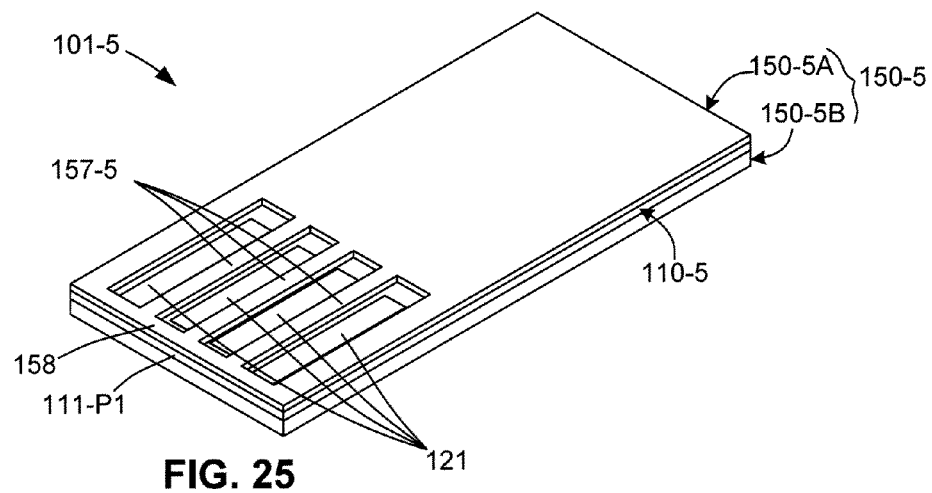
FIG. 25 is perspective view showing a "standard" type USB device including a single-shot molded housing including a front cross-rib according to another embodiment of the present invention.
Figure 26:
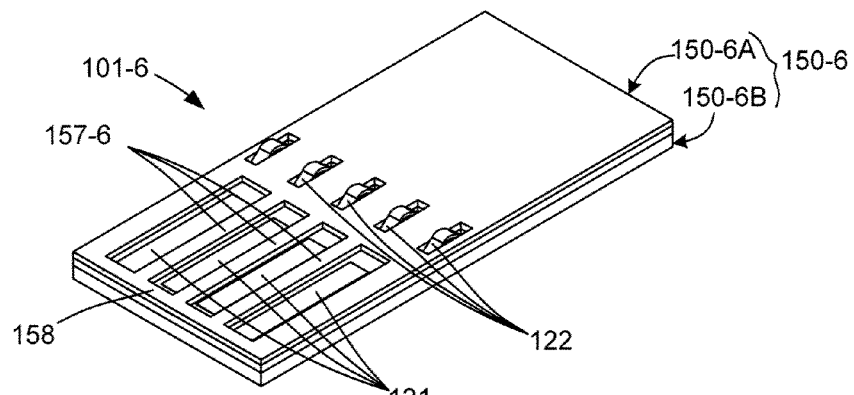
FIG. 26 is perspective view showing an EUSB device including a single-shot molded housing including a front cross-rib according to another embodiment of the present invention.

FIGS. 25 and 26 are perspective view showing USB devices including upper housing portions that include front cross-rib structures for protect the front edge of the associated PCBA, to prevent a user's finger from touching the front 4-pin standard USB contact pads, and to provide extra thickness for the five "extended" pins to form higher loops so that the spring action is more flexible. In particular, FIG. 25 shows a "standard" type USB device 101-5 including a PCBA 110-5 sandwiched between an upper housing portion 150-5A and a lower housing portion 150-5B, which make up a single-shot molded housing 150-5 formed in the manner similar to that described above (i.e., such that upper housing portion 150-5A includes a several elongated ribs 157-5 extending between associated pairs of metal contact pads 121). USB device 101-5 differs from previous embodiments in that upper housing portion 150-5A further includes a front cross-rib 158 extending along the front edge portion 111P-1 of PCBA 110-5, where front cross-rib 158 connects front portions of elongated ribs 157-5. Similarly, FIG. 26 shows an EUSB type device 101-6 including a PCBA 110-6 and a single-shot molded housing 150-6 made up of an upper housing portion 150-6A and a lower housing portion 150-6B, where upper housing portion 150-5A includes elongated ribs 157-6 that are connected by a cross-rib 158. As in the previous embodiments, metal contact pads 121 are exposed between ribs 157-6, and metal contact springs 122 are disposed behind metal contact pads 121.

Figure 27:
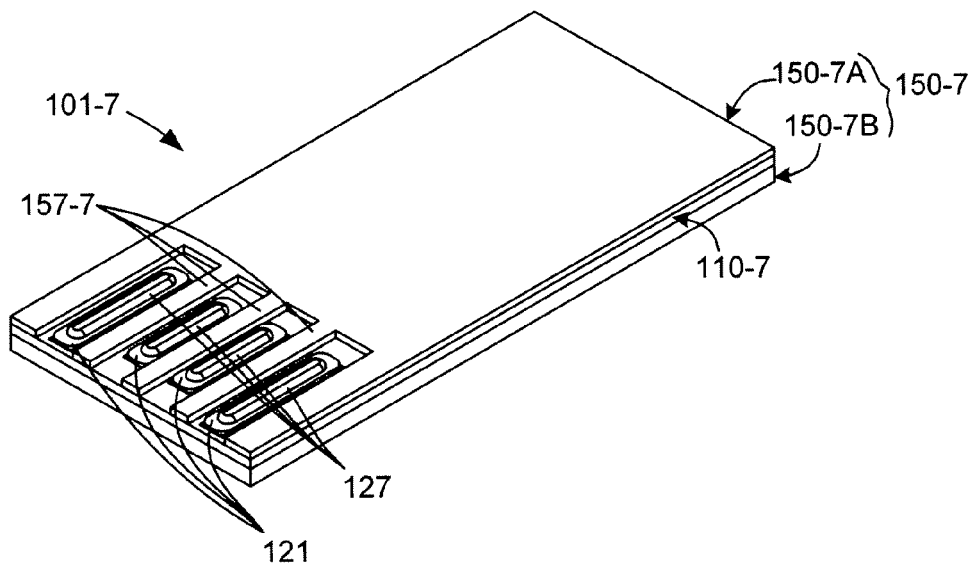
FIG. 27 is perspective view showing a "standard" USB device including a raised metal middle rail according to another embodiment of the present invention.
Figure 28:
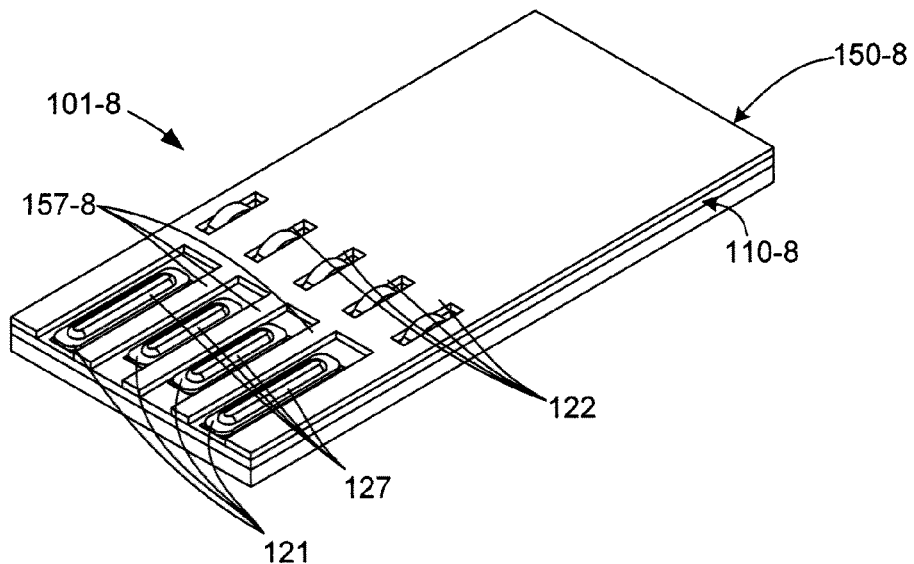
FIG. 28 is perspective view showing an EUSB device including a raised metal middle rail according to another embodiment of the present invention.

FIGS. 27 and 28 are perspective view showing USB devices that include raised metal rails for facilitating better contact between the spring metal pads and a host female USB connector (not shown). In particular, FIG. 27 shows a "standard" type USB device 101-7 including a PCBA 110-7 sandwiched between an upper housing portion 150-7A and a lower housing portion 150-7B of a single-shot molded housing 150-5. USB device 101-7 differs from previous embodiments in that PCBA 110-7 includes raised metal rails 127 that are processed using stamped and downset gold plated metal with the outer dimensions (OD) slightly larger than the underlying standard metal contact pads 121. Each raised metal rail 127 is soldered on top of a corresponding metal contact pad 121 during the SMT process. Similarly, FIG. 28 shows an EUSB type device 101-8 including a PCBA 110-8 and a single-shot molded housing 150-8, where PCBA 110-8 includes raised middle rails 127.

Figure 29A:
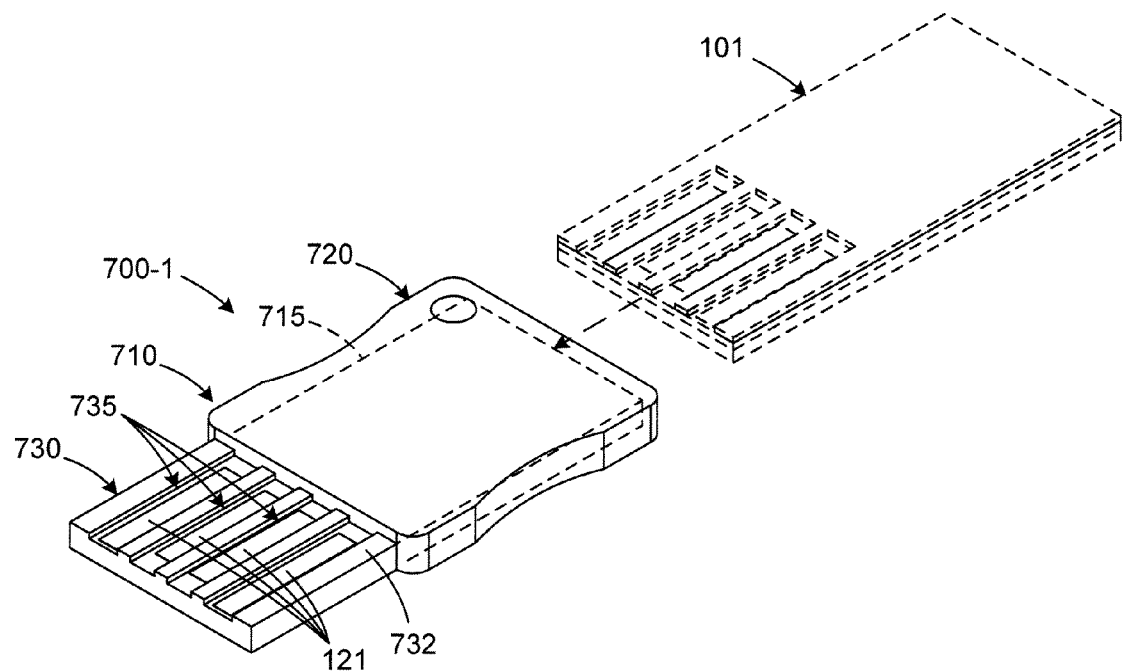
FIGS. 29(A) and 29(B) are perspective views showing USB assemblies including a plastic molded external housing for receiving a USB device according to another embodiment of the present invention.
Figure 29B:
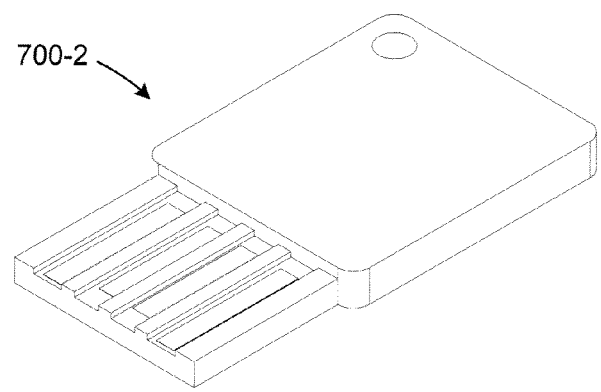
Figure 30A:
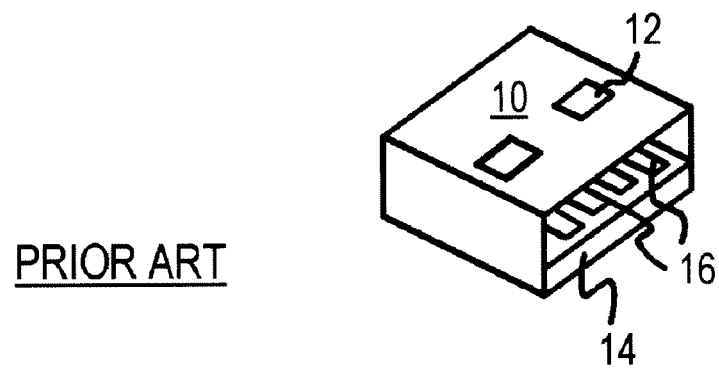
FIGS. 30(A) and 30(B) are front perspective views showing a conventional USB male plug and a conventional USB female socket, respectively.
Figure 30B:
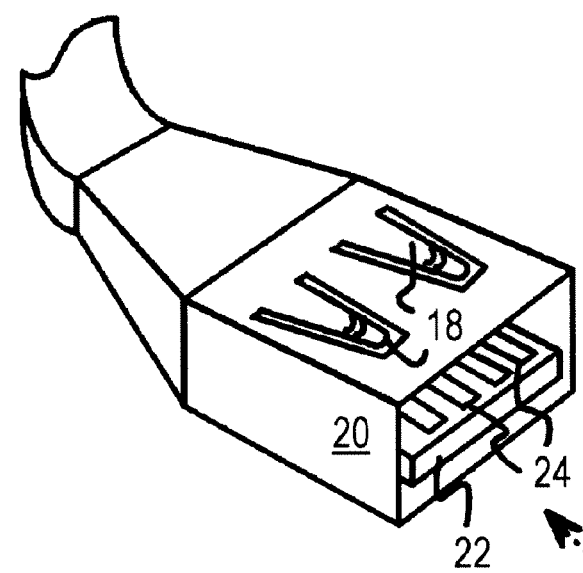

FIGS. 29(A) and 29(B) depict a Universal-Serial-Bus (EUSB) assembly 700-1 according to another specific embodiment that utilizes any of the USB/EUSB devices described above (indicated in FIG. 29(A) as USB/EUSB device 101) as a modular structure that is fixedly connected inside an external plastic case such that, as indicated in FIG. 29(A), metal contacts 121 of USB/EUSB device 101 are accessible through a front opening 735 defined a plug section 730 of case 710. Assembly 700 includes an integrally molded box-like body 710 having a handle section 720 and plug section 730. Body 710 defines an internal cavity 715 that extends from a back side of handle section 720 and into plug section 730. Plug section 730 includes a front end plate 732 that defines elongated front openings 735. During assembly, the front end of USB/EUSB device 101 is inserted into a rear opening of handle section 720 from the rear side, and is slid forward until metal contacts are exposed through openings 735. Note that, in EUSB embodiments, contact springs would also be exposed through corresponding openings formed in front end plate 732. As indicated in FIG. 29(B) assembly 700-2 includes straight sides, but is otherwise identical to assembly 700-1.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with specific reference to nine-pin extended USB memory cards, the present invention is also applicable to other EUSB devices, and using other extended USB communication systems (i.e., including a number of contact springs 122 other than five, as disclosed herein).

The invention claimed is:

1. A method for producing an Extended-Universal-Serial-Bus (EUSB) device on a printed circuit board (PCB) including opposing first and second surfaces and defining a plurality of openings that extend between the first and second surfaces, a plurality of metal contact pads disposed on the first surface, a plurality of first contact pads disposed on at least one of the first and second surfaces, and a plurality of second contact pads disposed on at least one of the first and second surfaces, wherein the method comprises:

attaching at least one integrated circuit (IC) die to the first contact pads and at least one passive component to the second contact pads;

mounting a plurality of contact springs onto the PCB such that each contact spring extends through a corresponding opening of said plurality of openings, and such that a contact portion of each contact spring protrudes above the first surface of said PCB;

forming a single-shot molded housing on both of the first surface and the second surface of the PCB such that a first housing portion is formed on said first surface and a second housing portion is formed on said second surface, the first housing portion being formed such that the formation of molding material on the plurality of metal contact pads and the plurality of contact springs is prevented, whereby each metal contact pad of said plurality of metal contact pads and each contact spring of the plurality of contact springs is exposed through openings in said first housing portion.

2. The method of claim 1, wherein mounting said plurality of contact springs comprises attaching base portions of each of said plurality of contact springs to a substrate, and then mounting said substrate onto the second surface of the PCB such that said contact portions protrude above the first surface, and such that the substrate covers the plurality of openings.

3. The method of claim 2, wherein forming the single-shot molded housing further comprises disposing a protrusion over the plurality of openings such that molding material is prevented from forming on said plurality of contact springs.

4. The method of claim 1, wherein forming the single-shot molded housing further comprises disposing a protrusion over each of the plurality of metal contact pads such that molding material is prevented from forming on said plurality of metal contact pads.

5. The method of claim 1, wherein attaching said at least one passive component comprises:

printing a solder paste on said second contact pads;

mounting said at least one component on said second contact pads; and reflowing the solder paste such that said at least one component is fixedly soldered to said second contact pads.

6. The method of claim 1, further comprising grinding a wafer including said at least one IC die such that a thickness of said wafer is reduced during said grinding, and then dicing said wafer to provide said at least one IC die.

7. The method of claim 6, wherein attaching at least one IC die comprises bonding said at least one IC die to the second surface of the PCB and wire bonding the at least one IC die to said first contact pads.

8. The method of claim 1, wherein producing the PCB comprises forming a PCB panel including at least ten of said PCBs arranged in two rows, and wherein the method further comprises singulating said PCB panel after forming said single-shot molded housing such that the molded housing includes a peripheral wall extending perpendicular to the PCB, and such that the peripheral wall is aligned with a peripheral edge of the PCB.

\* \* \* \* \*